United States Patent [19]

Ausschnitt et al.

[11] Patent Number: 5,965,309

[45] Date of Patent: Oct. 12, 1999

[54] FOCUS OR EXPOSURE DOSE PARAMETER CONTROL SYSTEM USING TONE REVERSING PATTERNS

[75] Inventors: Christopher P. Ausschnitt, Brookfield; Timothy A. Brunner, Ridgefield, both of Conn.; Mark E. Lagus, Millbrook, N.Y.

[73] Assignee: International Business Machines Corporation, Armonk, N.Y.

[21] Appl. No.: 08/921,986

[22] Filed: Aug. 28, 1997

[51] Int. Cl.⁶ .................................................... G03F 9/00
[52] U.S. Cl. ................................................................ 430/30
[58] Field of Search ................................................ 430/30

[56] References Cited

U.S. PATENT DOCUMENTS

| | | | |
|---|---|---|---|
| 3,689,162 | 9/1972 | Ferguson | 356/169 |
| 4,529,314 | 7/1985 | Ports | 356/375 |
| 4,555,798 | 11/1985 | Broadbent, Jr. et al. | 382/8 |
| 4,568,189 | 2/1986 | Bass et al. | 356/401 |
| 4,596,037 | 6/1986 | Bouchard et al. | 382/8 |
| 4,659,936 | 4/1987 | Kikkawa et al. | 250/560 |
| 4,783,826 | 11/1988 | Koso | 382/101 |
| 4,820,055 | 4/1989 | Müller | 356/401 |
| 4,853,967 | 8/1989 | Mandeville | 382/8 |
| 4,893,346 | 1/1990 | Bishop | 382/8 |
| 4,908,656 | 3/1990 | Suwa et al. | 355/53 |
| 4,908,871 | 3/1990 | Hara et al. | 382/8 |
| 4,981,372 | 1/1991 | Morimoto et al. | 382/8 |
| 5,103,104 | 4/1992 | Tissier et al. | 250/560 |
| 5,119,436 | 6/1992 | Holdgrafer | 382/8 |
| 5,216,257 | 6/1993 | Brueck et al. | 250/548 |
| 5,262,258 | 11/1993 | Yanagisawa | 430/22 |
| 5,272,763 | 12/1993 | Maruyama et al. | 382/8 |
| 5,309,198 | 5/1994 | Nakagawa | 355/67 |
| 5,386,294 | 1/1995 | Ototake et al. | 356/401 |
| 5,402,224 | 3/1995 | Hirukawa et al. | 356/124 |
| 5,418,613 | 5/1995 | Matsutani | 356/401 |
| 5,483,345 | 1/1996 | Donaher et al. | 356/363 |
| 5,629,772 | 5/1997 | Ausschnitt | 356/372 |

FOREIGN PATENT DOCUMENTS

| | | |
|---|---|---|
| 57-60206 | 4/1982 | Japan . |
| 85-050751 | 10/1984 | United Kingdom . |

OTHER PUBLICATIONS

Electrical Measurement for Characterizing Lithography, VLSI Electronics Microstructure Science, by Christopher P. Ausschnitt, vol. 16, pp. 320–356, 1987.

*Primary Examiner*—Christopher G. Young
*Attorney, Agent, or Firm*—DeLio & Peterson, LLC; Peter W. Peterson; Tiffany Townsend

[57] ABSTRACT

Focus and exposure parameters may be controlled in a lithographic process for manufacturing microelectronics by creating a complementary tone pattern of shapes and spaces in a resist film on a substrate. Corresponding dimensions of the resist shape and space are measured and the adequacy of focus or exposure dose are determined as a function of the measured dimensions. Etching parameters may also be controlled by creating a complementary tone pattern of etched shapes and spaces on a substrate. Corresponding dimensions of the etched shape and space are measured and the adequacy of etching parameters are determined as a function of the measured dimensions.

10 Claims, 23 Drawing Sheets

FIG. 2 (a) RADIO FREQUENCY POWER PULSE
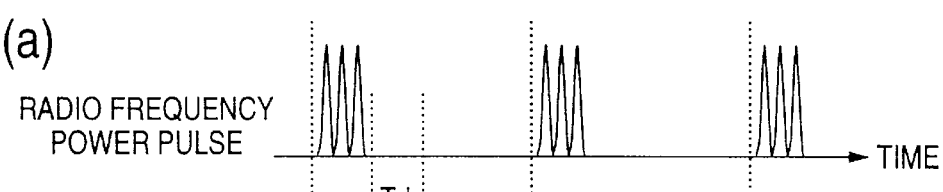
FIG. 2 (b) BIAS DC VOLTAGE PULSE
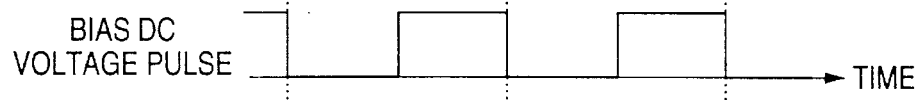
FIG. 2 (c) ELECTRON DENSITY
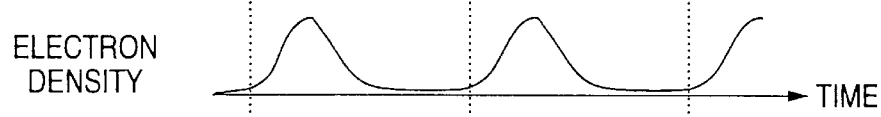
FIG. 2 (d) NEGATIVE ION DENSITY
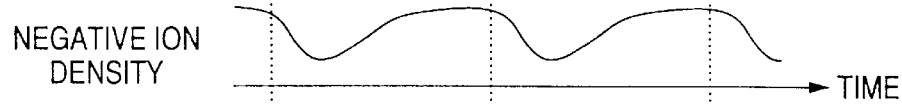
FIG. 2 (e) POSITIVE ION DENSITY
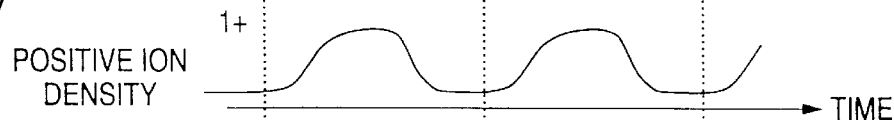
FIG. 2 (f) NEGATIVE ION CURRENT I- ELECTRON CURRENT Ie
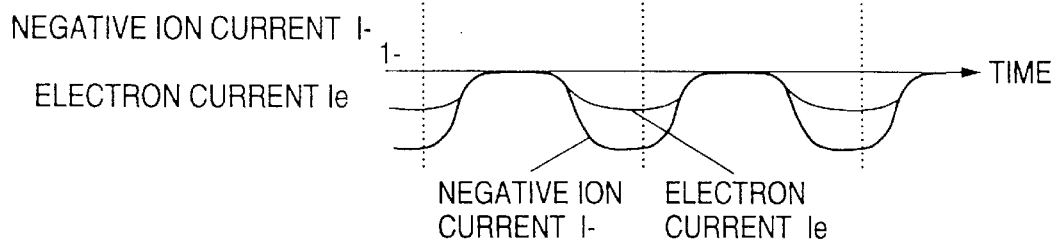

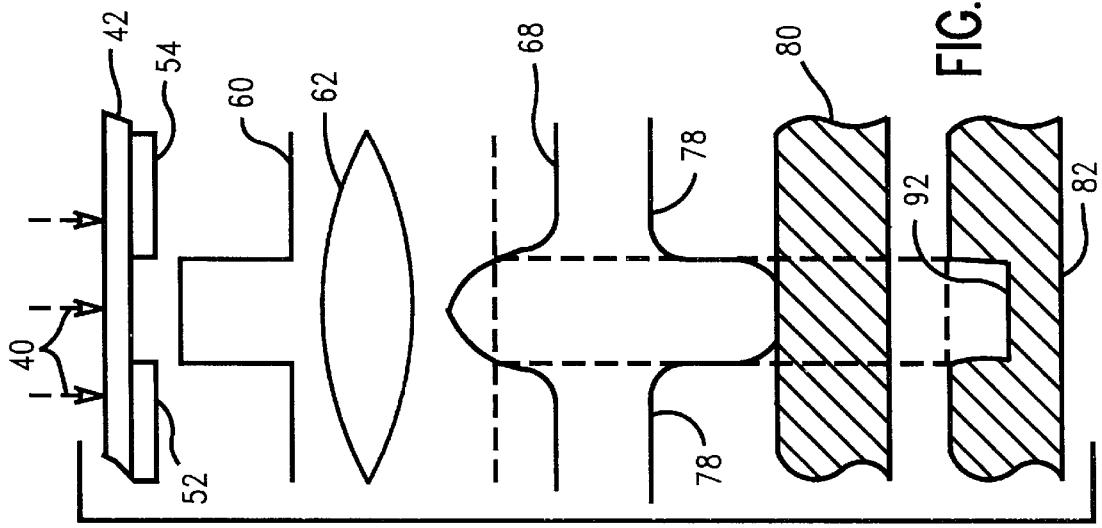
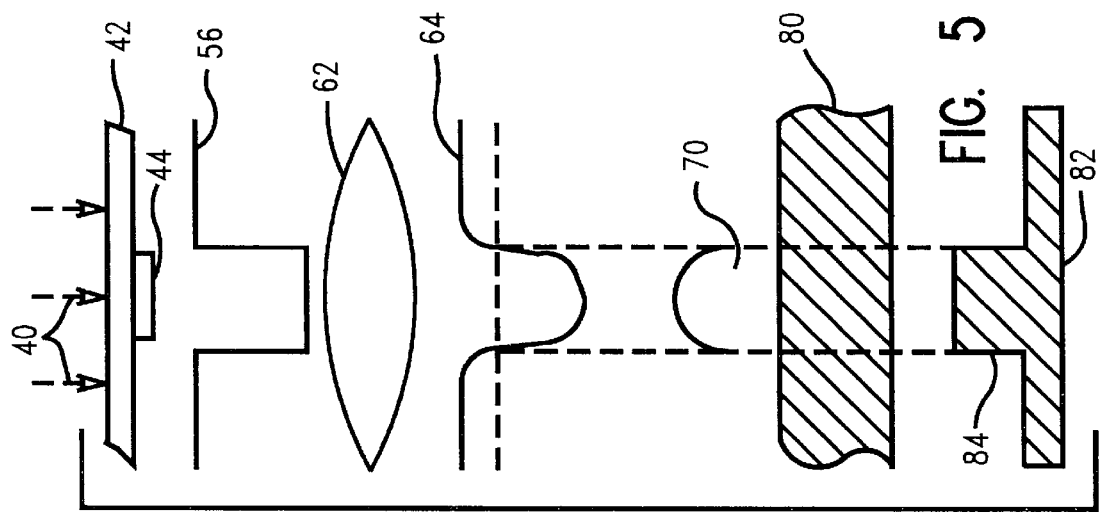
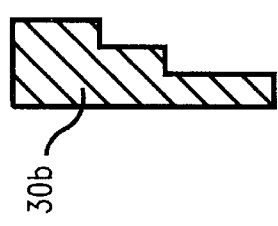
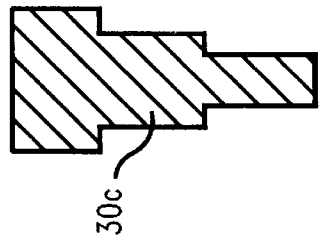

ETCH TONE REVERSAL-MEASURED OPTICALLY

FOCUS OR EXPOSURE DOSE PARAMETER CONTROL SYSTEM USING TONE REVERSING PATTERNS

This application is related to U.S. application Ser. No. 08/919,998 entitled Metrology Method Using Tone Reversed Pattern, and U.S. application Ser. No. 08/929,341 entitled Optically Measurable Serpentine Edge Tone Reversed Targets, and U.S. application Ser. No. 08/919,993 entitled Optical Metrology Tool And Method Of Using Same, all filed on even date herewith.

BACKGROUND OF THE INVENTION

1. Field of the Invention

The present invention relates generally to manufacturing processes requiring lithography and, more particularly, to monitoring of lithographic and etch process conditions used in microelectronics manufacturing which is particularly useful for monitoring pattern features with dimensions on the order of less than 0.5 micron.

2. Description of Related Art

Control of a lithographic imaging process requires the optimization of exposure and focus conditions in lithographic processing of product wafers. Likewise, it is also important to optimize etching and other parameters on product wafers. The current solution to the above problems entails the collection and analysis of critical dimension measurements using SEM metrology on multiple pattern types at multiple locations within the chip, and from chip-to-chip. This method is slow, expensive and error-prone. It usually requires the exposure of multiple focus-exposure and etching matrices on product wafers.

Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the term "bias" is invariably used in conjunction with a process such as resist imaging, etching, developing etc. and described by terms such as image bias, etch bias, print bias etc.

Monitoring of pattern features and measurement of its dimensions (metrology) is typically performed using either a scanning electron microscope (SEM) or an optical tool. Current practice in the semiconductor industry is to use topdown SEMs for the in-line metrology of all critical dimensions below approximately 0.7 um. Unfortunately, SEM metrology is expensive to implement, relatively slow in operation and difficult to automate. At best, algorithms that attempt to determine the absolute dimensions at a fixed pattern height (e.g., the interface of the pattern with the underlying substrate), are accurate to only 30–50 nm—a substantial fraction, if not all, of current critical dimension tolerance. The need to measure individual features below 0.25 um poses a serious challenge not just to their imaging capability, but to all the subsystems required for automated measurement—pattern recognition, gate placement, edge detection, and the like.

Although optical metrology overcomes the above drawbacks associated with SEM and AFM metrology, optical metrology systems are unable to resolve adequately for measurement of feature dimensions of less than about 1 micron. Additionally, false sensitivity has limited the applicability of optical microscopy to sub-micron metrology on semiconductor product wafers.

The degradation of optical resolution as chip dimensions approach the wavelength of light precludes the application of optical microscopy to the measurement of individual chip features. Even setting aside the accuracy requirement for in-line metrology, the blurred images of adjacent edges overlap and interfere, and the behavior of the intensity profile of the image no longer bears any consistent relationship to the actual feature on the wafer. It is this loss of measurement "consistency" (definable as a combination of precision and sensitivity) that establishes the practical limit of conventional optical metrology in the range of 0.5–1.0 um.

With regard to false sensitivity, the thin films used in semiconductor manufacturing vary widely in their optical characteristics. Optical metrology is susceptible to variations in the thickness, index of refraction, granularity and uniformity of both the patterned layer and underlying layers. Film variations that affect the optical image can be falsely interpreted as variations in the pattern dimension.

Improvements in monitoring bias in lithographic and etch processes used in microelectronics manufacturing have been disclosed in U.S. patent application Ser. Nos. 08/359,797, 08/560,720 and 08/560,851. In Ser. No. 08/560,851, a method of monitoring features on a target using an image shortening phenomenon was disclosed. In Ser. No. 08/560,720, targets and measurement methods using verniers were disclosed to measure bias and overlay error. In these applications, the targets comprised arrays of spaced, parallel elements having a length and a width, with the ends of the elements forming the edges of the array. While the targets and measurement methods of these applications are exceedingly useful, they rely on the increased sensitivity to process variation provided by image shortening.

Accordingly, there is still a need for a method of monitoring pattern features of arbitrary shape with dimensions on the order of less than 0.5 micron, and which is inexpensive to implement, fast in operation and simple to automate. There is a need for a process for determining bias which enables in-line lithography/etch control using optical metrology, and wherein SEM and/or AFM metrology is required only for calibration purposes.

Bearing in mind the problems and deficiencies of the prior art, it is therefore an object of the present invention to provide a measurement tool, test pattern and evaluation method for determining exposure and focus conditions whereby one pattern group is capable of distinguishing between exposure and focus problems in semiconductor pattern processing.

It is another object of the present invention to provide a measurement tool, test pattern and evaluation method for determining etching time and rate conditions and other etching process conditions whereby one pattern group is capable of distinguishing between etching time and rate problems and other etching process problems in semiconductor pattern processing.

A further object of the invention is to provide a method of evaluating focus-exposure and etching parameters which may be used with existing metrology instruments and exposure and etching equipment.

It is yet another object of the present invention to provide a method of evaluating focus-exposure and etching parameters which is easy and inexpensive to utilize.

It is also an object of the present invention to provide a method and target for determining bias and overlay error in patterns deposited as a result of lithographic processes.

It is a further object of the present invention to provide a method and target which combines measurement of bias and overlay error in deposited patterns, and which utilize little space on a wafer substrate.

It is a further object of the present invention to provide a process for measuring bias using targets which are intentionally not resolved by the metrology tool employed.

Still other objects and advantages of the invention will in part be obvious and will in part be apparent from the specification.

SUMMARY OF THE INVENTION

The above and other objects, which will be apparent to those skilled in the art, are achieved in the present invention which relates to a process for controlling focus or exposure dose parameters in a lithographic process comprising first exposing a complementary tone pattern onto a resist film layer having a resist threshold disposed on a substrate. The complementary tone pattern comprises a first pattern portion having a shape which corresponds to an area on the resist film having an exposure dose below the resist threshold of the resist film and a second pattern portion having a space which corresponds to an area on the resist film having an exposure dose above the resist threshold of the resist film. The shape and space have corresponding dimensions of a known relationship, for example, equal dimensions. Next, there is created on the resist film a latent image of the space and an unexposed area within a latent image of the shape. Then the dimension on the latent image space and the dimension on the unexposed area within the latent image shape are measured. Finally, the adequacy of focus or exposure dose parameters is determined as a function of the measured dimensions of the latent image shape and space.

In another aspect, the present invention relates to a process for controlling focus or exposure dose parameters in a lithographic process comprising first exposing a complementary tone pattern onto a resist film layer having a resist threshold disposed on a substrate. The complementary tone pattern comprises a first pattern portion having a shape which corresponds to an area on the resist film having an exposure dose below the resist threshold of the resist film and a second pattern portion having a space which corresponds to an area on the resist film having an exposure dose above the resist threshold of the resist film. The shape and space have corresponding dimensions of a known relationship, for example, equal dimensions. There is subsequently created on the resist film a latent image of the space and an unexposed area within a latent image of the shape. Next, one contacts the latent image space and the shape on the resist film with a developer to remove selected portions of the resist film to create developed images corresponding to the latent image space and the shape, respectively. Then, the dimension on the developed image shape and the dimension on the developed image space are measured. The adequacy of focus or exposure dose parameters is determined as a function of the measured dimensions of the developed image shape and space.

The process may include determining the difference of the measured dimensions on the developed image shape and space and, if the difference is outside of a predetermined tolerance, modifying the exposure dose parameter of the process. Preferably, the steps are repeated until the difference of the measured dimensions on the developed image shape and space is within the predetermined tolerance.

The process may also include determining the sum of the measured dimensions on the developed image shape and space and, if the sum is outside of a predetermined tolerance, modifying the focus parameter of the process. Preferably, the steps are repeated until the sum of the measured dimensions on the developed image shape and space is within the predetermined tolerance.

In one preferred embodiment, the shape and space are rectangular having a width and a length, and the focus or exposure dose parameters are determined as a mathematical function of the width or length dimensions on the developed image shape and space. The rectangular shape and space may have a width and a length greater than the width, and the focus or exposure dose parameters may be determined as a mathematical function of the length dimensions on the developed image shape and space.

In another preferred embodiment, the shape and space have opposed points formed by acute angles, and the focus or exposure dose parameters are determined as a mathematical function of the distances between the opposed points formed by acute angles on the developed image shape and space.

The process may further include the step of mapping measured corresponding dimensions of developed image shapes and spaces, and the function of the measured corresponding dimensions, over a plurality of focus and exposure conditions. If the determination of adequacy of focus or exposure dose parameters is outside of a predetermined tolerance, the focus or exposure dose parameter of the process may be modified by utilizing information from the mapping step.

In yet another aspect, the present invention provides a process for controlling etching or other parameters in an etching process comprising first providing a substrate having an overlying resist film layer with a complementary tone developed image pattern comprising a first pattern portion having a developed image shape made of the resist film, and a second pattern portion having a developed image space removed from the resist film. The shape and space have corresponding dimensions of a known relationship, for example, equal dimensions. Next, there is provided an etchant for removing substrate material not covered by the resist film, and the developed image shape and space is contacted with the etchant for a desired time to create an etched image of the developed image shape on the substrate and an etched image of the developed image space on the substrate. The dimension on the etched image shape and the dimension on the etched image space are measured. The adequacy of etching or other parameters is determined as a function of the measured dimensions on the etched image shape and space.

The process may include determining the difference of the measured dimensions on the etched image shape and space and, if the difference is outside of a predetermined tolerance, modifying the etching time parameter of the process. Preferably, the steps are repeated until the difference of the measured dimensions on the etched image shape and space is within the predetermined tolerance.

The process may also include determining the sum of the measured dimensions on the etched image shape and space and, if the sum is outside of a predetermined tolerance, modifying a parameter of the process other than the etching time. Preferably, the steps are repeated until the sum of the measured dimensions on the etched image shape and space is within the predetermined tolerance In one preferred embodiment, the shape and space are rectangular having a width and a length, and the focus or exposure dose parameters are determined as a mathematical function of the width or length dimensions on the etched image shape and space. The rectangular shape and space may have a width and a length greater than the width, and wherein the focus or exposure dose parameters are determined as a mathematical function of the length dimensions on the etched image shape and space.

In another preferred embodiment, the latent image shape and space have opposed points formed by acute angles in the images, and the focus or exposure dose parameters are determined as a mathematical function of the distances between the opposed points formed by acute angles on the etched image shape and space.

The process may further include the step of mapping measured corresponding dimensions of etched image shapes and spaces, and the function of the measured corresponding dimensions, over a plurality of etching conditions. If the determination of adequacy of etching parameters is outside of a predetermined tolerance, the etching parameter of the process may be modified by utilizing information from the mapping step.

In another aspect, the present invention relates to a process for controlling focus or exposure dose parameters in a lithographic process comprising the steps of:

a) exposing a plurality of a first set of complementary tone patterns onto a resist film layer having a resist threshold disposed on a substrate, each of said first set of complementary tone patterns comprising: i) a first pattern portion having a shape which corresponds to an area on the resist film having an exposure dose below the resist threshold of the resist film and ii) a second pattern portion having a space which corresponds to an area on the resist film having an exposure dose above the resist threshold of the resist film, said shape and space having corresponding dimensions, each of said exposed first set of complementary tone patterns being exposed on said resist film under different focus or exposure dose conditions;

b) measuring said dimensions of image shapes and spaces on each of said exposed first set of complementary tone patterns;

c) determining optimum focus or exposure dose conditions based on the measurements of step (b);

d) determining the dependence of focus or exposure dose conditions on said dimensions of the image shapes and spaces near the optimum focus or exposure dose conditions determined in step (c);

e) exposing one or more of a second set of complementary tone patterns onto a resist film layer having a resist threshold disposed on a substrate, each of said second set of complementary tone patterns comprising: i) a first pattern portion having a shape which corresponds to an area on the resist film having an exposure dose below the resist threshold of the resist film and ii) a second pattern portion having a space which corresponds to an area on the resist film having an exposure dose above the resist threshold of the resist film, said shape and space having corresponding dimensions;

f) measuring said dimensions of image shapes and spaces on each of said exposed second set of complementary tone patterns; and g) determining adequacy of focus or exposure dose parameters on each of said exposed second set of complementary tone patterns based on the measurements and determinations of steps (a)–(d).

The process may further include the step of:

h) establishing focus or exposure dose parameters for subsequent exposure of a third set of complementary tone patterns by applying a measurement of said dimensions of image shapes and spaces on at least one of said exposed second set of complementary tone patterns to the dependence of focus or exposure dose conditions made in step (d).

The process may also include the further step of:

h) establishing focus or exposure dose parameters for subsequent exposure of a third set of complementary tone patterns by applying a measurement of said dimensions of image shapes and spaces on at least one of said exposed second set of complementary tone patterns to the dependence of focus or exposure dose conditions made in step (d) to predict a new focus or exposure dose parameter, and taking an average of the predicted new focus or exposure dose parameter and the focus or exposure dose parameter of said at least one of said exposed second set of complementary tone patterns.

Said dimensions of said shape and space may be nominally identical, such that the adequacy of focus or exposure dose parameters are determined based on the dimensions on said image shape and space.

The measuring of the dimensions of the image shapes and spaces on each of the exposed first and second sets of complementary tone patterns in steps (b) and (f) is by the steps of:

i) creating on said resist film a latent image of each space and an unexposed area within a latent image of each shape;

ii) measuring the dimension on each latent image space; and iii) measuring the dimension on the unexposed area within each latent image shape.

Alternatively, the measuring of the dimensions of the image shapes and spaces on each of the exposed first and second sets of complementary tone patterns in steps (b) and (f) is by the steps of:

i) creating on said resist film a latent image of each space and an unexposed area within a latent image of each shape;

ii) contacting each latent image space and shape on the resist film with a developer to remove selected portions of the resist film to create developed images corresponding to each latent image space and shape, respectively;

iii) measuring the dimension on each developed image shape; and iv) measuring the dimension on each developed image space.

In one embodiment, said shape and space are rectangular having a width and a length, for example with a length greater than said width, such that the adequacy of focus or exposure dose parameters are determined based on the width or length dimensions on said image shape and space. In another embodiment, said shape and space have opposed points formed by acute angles, for example with a length greater than said width, such that the adequacy of focus or exposure dose parameters are determined as a mathematical function of the distances between the opposed points formed by acute angles on said image shape and space.

In a related aspect, the present invention provides a process for controlling etching or other parameters in a lithographic process comprising the steps of:

a) providing a plurality of a first set of complementary tone developed image patterns on a resist film layer on a substrate, each of said first set of complementary tone patterns comprising: i) a first pattern portion having a developed image shape made of said resist film and ii) a second pattern portion having a developed image space removed from said resist film, said shape and space having corresponding dimensions;

b) etching each of said developed first set of complementary tone patterns under different etching conditions to create an etched image of said developed image shape and an etched image of said developed image space;

c) measuring the dimensions of the etched image shapes and spaces on each of said exposed first set of complementary tone patterns;

d) determining optimum etching or other conditions based on the measurements of step (c);

e) determining the dependence of etching or other conditions on said dimensions of the image shapes and spaces near the optimum etching or other conditions determined in step (d);

f) providing one or more of a second set of complementary tone developed image patterns on a resist film layer on a substrate, each of said second set of complementary tone patterns comprising: i) a first pattern portion having a developed image shape made of said resist film and ii) a second pattern portion having a developed image space removed from said resist film, said shape and space having corresponding dimensions;

g) measuring said dimensions of the etched image shapes and spaces on each of said exposed second set of complementary tone patterns; and h) determining adequacy of etching or other parameters on each of said exposed second set of complementary tone patterns based on the measurements and determinations of steps (a)–(e).

The process may further include the step of:

i) establishing etching or other parameters for subsequent etching of a third set of complementary tone patterns by applying a measurement of said dimensions of image shapes and spaces on at least one of said etched second set of complementary tone patterns to the dependence of etching or other conditions made in step (e).

The process may also include the further step of:

i) establishing etching or other parameters for subsequent etching of a third set of complementary tone patterns by applying a measurement of said dimensions of image shapes and spaces on at least one of said etched second set of complementary tone patterns to the dependence of etching or other conditions made in step (e) to predict a new etching or other parameter, and taking an average of the predicted new etching or other parameter and the etching or other parameter of at least one of said etched second set of complementary tone patterns.

The dimensions of said shape and space may be nominally identical, such that the adequacy of etching or other parameters are determined based on the dimensions on said image shape and space. In one embodiment, said shape and space are rectangular having a width and a length, for example with a length greater than said width, such that the adequacy of etching or other parameters are determined based on the width or length dimensions on said image shape and space. In another embodiment, said shape and space have opposed points formed by acute angles, for example with a length greater than said width, such that the adequacy of etching or other parameters are determined as a mathematical function of the distances between the opposed points formed by acute angles on said image shape and space.

In yet another aspect, the present invention relates to a target for measurement of parameters on a substrate formed by a lithographic process comprising a contrasting area on said substrate having a linear edge, and a contrasting array of elements on said substrate. The array comprises a plurality of spaced parallel elements contrasting with said substrate and extending from a first element to a last element, each of said elements having length and width, ends of the contrasting elements being aligned along parallel lines forming opposite array edges, the length of the contrasting elements comprising the array width and the distance between opposite far edges of the first and last elements comprising the array length, the linear edge of said contrasting area contacting each of said contrasting elements along one edge of said array. The array width is measurable by microscopy without resolution of individual elements of the array to determine a parameter of said substrate.

The linear edge of said contrasting area may extend beyond at least one of said first or last elements and said contrasting area may further include a portion contacting said last element along the opposite far edge. The array width is also measurable by microscopy without resolution of individual elements of the array to determine a parameter of said substrate. The width of each element may be constant over the element length, or the width of each element may taper down from the contrasting area linear edge over the element length.

The target may further include a second contrasting array of elements on said substrate. Said second array may comprise a plurality of spaced parallel elements contrasting with said substrate and extending from a first element to a last element, each of said elements having length and width, ends of the contrasting elements being aligned along parallel lines forming opposite array edges, the length of the contrasting elements comprising the second array width and the distance between opposite far edges of the first and last elements comprising the second array length. Said second contrasting array is spaced from the first array edge opposite the linear edge of said contrasting area, and the second array width is measurable by microscopy without resolution of individual elements of the second array to determine a parameter of said substrate.

Preferably, the first and second array edges are parallel, and the lengths of said first and second arrays are substantially equal, wherein said first and second arrays are spaced from each other by a distance equal to the width of said arrays.

The target may further include a second linear edge on said contrasting area parallel to and spaced from said first linear edge on a side opposite said first contrasting array, and a second contrasting array of elements on said substrate. Said second array comprises a plurality of spaced parallel elements contrasting with said substrate and extending from a first element to a last element, each of said elements having length and width, ends of the contrasting elements being aligned along parallel lines forming opposite array edges, the length of the contrasting elements comprising the second array width and the distance between opposite far edges of the first and last elements comprising the second array length, the second linear edge of said contrasting area contacting each of said contrasting elements along one edge of said second array. The second array width is measurable by microscopy without resolution of individual elements of the second array to determine a parameter of said substrate.

Preferably, the first and second array edges are parallel, and the lengths of said first and second arrays are substantially equal, wherein said first and second arrays are spaced from each other by a distance equal to the width of said arrays.

The target may further include a third contrasting array of elements on said substrate. Said third array comprises a plurality of spaced parallel elements contrasting with said substrate and extending from a first element to a last element, each of said elements having length and width, ends of the contrasting elements being aligned along parallel lines forming opposite array edges, the length of the contrasting elements comprising the third array width and the distance between opposite far edges of the first and last elements comprising the third array length. Said third contrasting array is spaced from the first array edge opposite the first linear edge of said contrasting area, and the third array width is measurable by microscopy without resolution of individual elements of the third array to determine a parameter of said substrate.

Preferably, the first and third array edges are parallel, and the lengths of said first and third arrays are substantially equal, wherein said first and third arrays are spaced from each other by a distance equal to the width of said arrays.

The target may further include a second contrasting area having a third linear edge on said second contrasting area parallel to and spaced from said first and second linear edges of said first contrasting area, said third linear edge contacting each of the contrasting elements of said third contrasting array along an edge of said third array on a side opposite said first contrasting array. Preferably, the first and third array edges are parallel, the width of said first and third arrays are substantially equal, and said first and third arrays are spaced from each other by a distance equal to the width of said arrays, wherein the width of said first and contrasting second areas is normal to the linear edges of said areas and wherein said first and second contrasting areas have lengths equal to the lengths of said arrays.

In a related aspect, the present invention provides a method of measuring parameters on a substrate formed by a lithographic process comprising the steps of:

a) providing a target comprising a contrasting area formed on a substrate by a lithographic process, said contrasting area having a linear edge; and a contrasting array of elements on said substrate, said array comprising a plurality of spaced parallel elements contrasting with said substrate and extending from a first element to a last element, each of said elements having length and width, ends of the contrasting elements being aligned along parallel lines forming opposite array edges, the length of the contrasting elements comprising the array width and the distance between opposite far edges of the first and last elements comprising the array length, the linear edge of said contrasting area contacting each of said contrasting elements along one edge of said array;

b) resolving said array edges without resolving individual elements of the array; and c) measuring the position of said array edges to determine a desired parameter of said substrate.

Preferably, step (c) comprises determining the position of a centerline between two of said array edges. The method may further include the steps of:

i) providing a second contrasting array of elements on said substrate, said second array comprising a plurality of spaced parallel elements contrasting with said substrate and extending from a first element to a last element, each of said elements having length and width, ends of the contrasting elements being aligned along parallel lines forming opposite array edges, the length of the contrasting elements comprising the second array width and the distance between opposite far edges of the first and last elements comprising the second array length, and wherein said second contrasting array is spaced from the first array edge opposite the linear edge of said contrasting area;

ii) resolving said first and second array edges without resolving individual elements of the arrays; and iii) measuring the position of said first and second array edges to determine a desired parameter of said substrate.

The method may further include the steps of:

i) further including a second linear edge on said contrasting area parallel to and spaced from said first linear edge on a side opposite said first contrasting array, and a second contrasting array of elements on said substrate, said second array comprising a plurality of spaced parallel elements contrasting with said substrate and extending from a first element to a last element, each of said elements having a length and width, ends of the contrasting elements being aligned along parallel lines forming opposite array edges, the length of the contrasting elements comprising the second array width and the distance between opposite far edges of the first and last elements comprising the second array length, the second linear edge of said contrasting area contacting each of said contrasting elements along one edge of said second array;

ii) resolving said first and second array edges without resolving individual elements of the arrays; and iii) measuring the position of said first and second array edges to determine a desired parameter of said substrate.

Step (iii) may comprise determining the position of a centerline between two of said array edges.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 is an enlargement of one embodiment of the apex of the triangles of FIG. 2 made by a single-sided stepping pattern.

FIG. 4 is an enlargement of another embodiment of the apex of the triangles of FIG. 2 made by a symmetrical stepping pattern.

FIG. 5 shows a portion of the photolithography process for one embodiment of the present invention utilizing an isolated opaque shape on an essentially transparent mask.

FIG. 6 shows a portion of the photolithography process for another embodiment of the present invention utilizing an isolated transparent shape on an essentially opaque mask.

DESCRIPTION OF THE PREFERRED EMBODIMENT(S)

Figure 1:
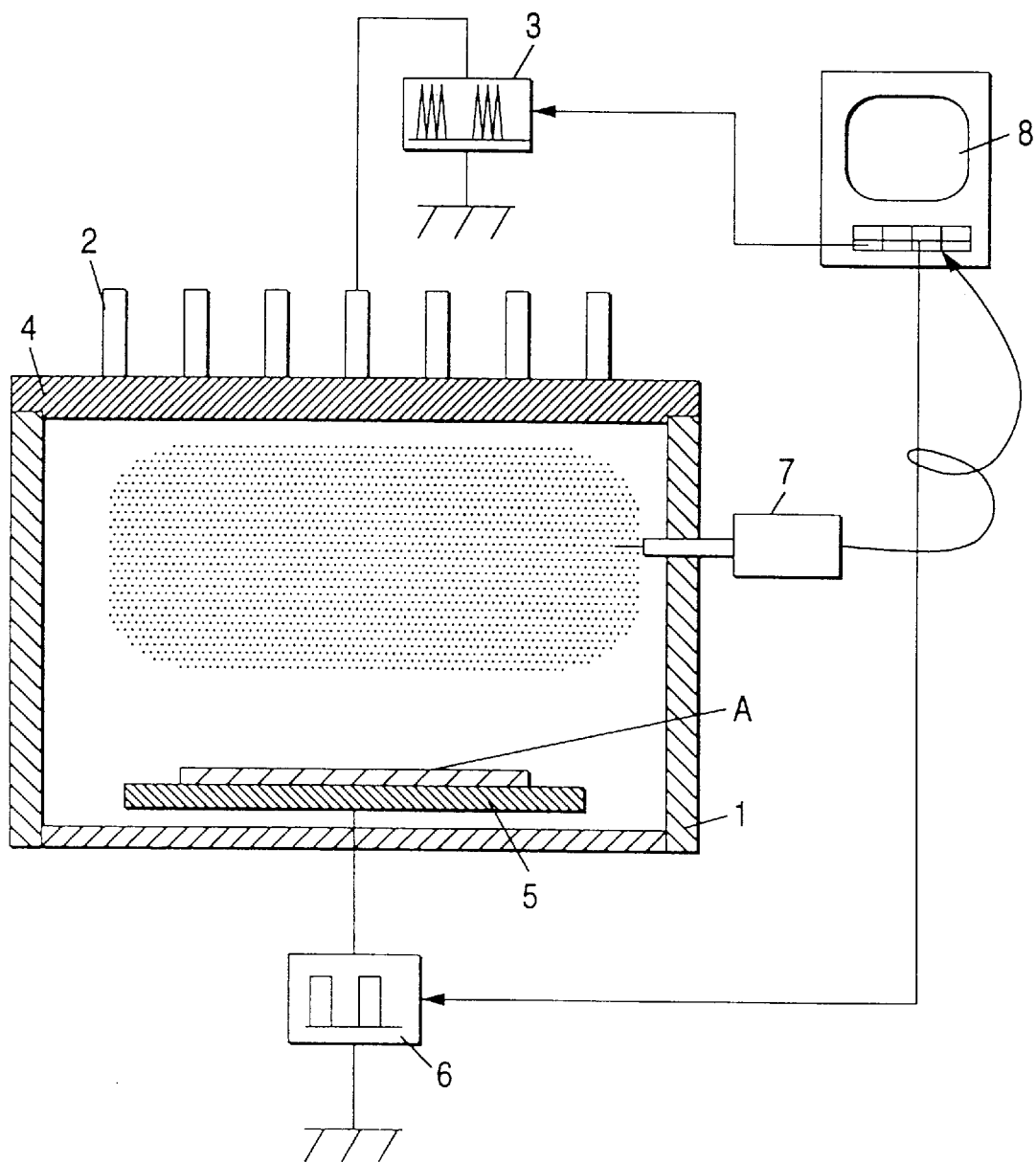
FIG. 1 is a plan view of an embodiment of complementary rectangular shape (opaque) and space (transparent) patterns on a mask used for photo lithography.

In describing the preferred embodiment of the present invention, reference will be made herein to FIGS. 1–36 of the drawings in which like numerals refer to like features of the invention. Features of the invention are not necessarily shown to scale in the drawings.

The present invention utilizes a pattern control system based on the measurement of complementary tone patterns, i.e., patterns in which the tone is reversed. The "tone" of a lithographic pattern is determined by the presence or absence of resist material which is normally deposited in a layer or film on the surface of the substrate to be etched. Patterns are either resist shapes on a clear background or the absence of resist shapes (i.e., spaces) in a background of resist material. Complementary tone patterns can be formed by interchanging the areas that are exposed during the lithographic process.

These tone patterns may be created in resist material by preparing masks with opaque and transparent areas corresponding to the shapes or spaces to be created on the resist material, and then using a source of radiation on one side of the mask to illuminate and project the mask shapes and spaces on the resist layer on the opposite side of the mask. Resist layers have a resist threshold. When exposed to radiation or energized above the resist threshold, a latent image is formed. No latent image is created when the level of exposure to radiation is below the resist threshold. These mask shapes and spaces form corresponding latent images on the resist layer. The latent images are manifested by changes in film reflectivity and may be optically detected before developing by visual observation, for example, with a microscope.

Alternatively, complementary tone patterns may be exposed on resist material by other types of masks, for example, phase shift masks, or other methods, for example, an electron beam exposure tool. Instead of using masks, these other methods may form the shapes and spaces by multiple exposure of pixels or other discrete forms.

After the latent images on the resist material are developed, an etchant is used to attack the substrate not covered by the resist material. The etched areas or spaces of the substrate form trenches in the substrate, leaving the unetched areas or shapes as raised structures adjacent to the trenches. The etched images are formed by the walls between the raised areas and trenches, and will also form complementary etched images corresponding to the complementary tone patterns on the resist film.

As shown in FIG. 1, a mask 42 substantially transparent to an illuminating light source used for exposing resist films has thereon translucent or opaque areas 22, 24 which substantially block the transmission of the light source. These will be referred to herein as "opaque" mask areas, although the degree of opacity is only that sufficient to distinguish the opaque area from the substantially transparent area. Opaque mask area 24 is shown having a substantially transparent area 26 in the shape of a rectangle. A complementary rectangular opaque mask area 24 on an otherwise substantially transparent portion of substrate 42 is also shown. The width $W_l$ of opaque mask area 22 is equal to the width $W_s$ of transparent space 26. Likewise, the length $L_l$ of opaque mask area 22 is equal to the length $L_s$ of transparent area 26. The opaque and transparent areas having at least one corresponding dimension, and preferably all corresponding dimensions, are complementary mask areas.

Figure 2:
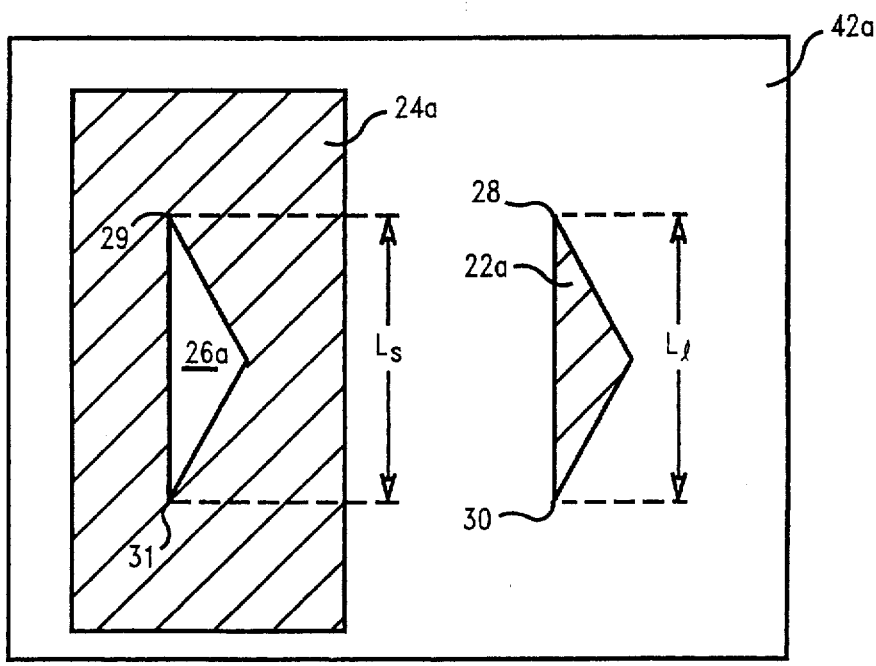
FIG. 2 is a plan view of an embodiment of complementary triangular shape (opaque) and space (transparent) patterns on a mask used for photo lithography.

Another example of complementary mask patterns is depicted in FIG. 2 where a triangular shaped transparent area 26a in an opaque mask area 24a has dimensions corresponding to the triangular shaped opaque mask area 22a on a transparent mask background. Both the transparent area 26a and the opaque area 22a have opposing ends in the form of acute angles with the distance between the opposed points comprising the length $L_l$. These opposing ends are shown on the opaque triangle 22a as ends 28, 30, and in the transparent triangle 26a as ends 29, 31.

The relationship between the corresponding dimensions of the mask shape and space should be known. In FIGS. 1 and 2, all of the corresponding mask shape and space dimensions are equal.

As shown more clearly in FIGS. 3 and 4, the actual tapered or angled sides forming the end points of the triangle shaped end 30 as shown in FIG. 2 can be formed by stepping the patterns in increments of the minimum design grid, typically 25 nm. A single-sided stepping pattern can be used as shown on end 30b in FIG. 3 or a symmetrical stepping pattern can be used as shown on end 30c in FIG. 4. The single sided stepping (FIG. 3) has the advantage that a more gradual taper is possible, resulting in a more acute angle for the end of the shape. Likewise, the mask transparent area is also formed by stepping pattern in the surrounding opaque mask material.

The lithographic process preferably employed in connection with the present invention is shown in FIGS. 5 and 6. In each of these preferred embodiments, a mask or reticle pattern is transferred via spatially modulated light 40 through a lens 62 to create an aerial image which is transferred to the resist film on a substrate. In FIG. 5, this is shown as an isolated opaque area 44 on a transparent mask background 42 of intensity 56 which forms aerial image 64. In FIG. 6, this is shown as opaque areas 52 and 54 on transparent mask 42 having an isolated transparent area between opaque areas of intensity 60, which forms aerial image 68.

Those segments of the absorbed aerial image, whose energy exceeds a threshold energy of chemical bonds in the photo-active component (PAC) of the resist material, create a latent image in the resist film. In some resist systems, the latent image is formed directly by the PAC. In others (so-called acid-catalyzed resist), the photo-chemical interaction first generates acid which reacts with other resist components during a post-exposure bake to form the latent image. In either case, the latent image marks the volume of resist material that either is removed during the development process (in the case of positive resist) or remains after development (in the case of negative resist) to create a three-dimensional pattern in the resist film. The remaining resist material is shown in FIGS. 5 and 6 as 70 and 78, respectively, on substrate 80.

Subsequently, an etchant for the substrate which is unreactive with the resist film is then applied and etches the substrate in the area in which the resist film is not present. The etched image is shown in FIG. 5 as shape 84 on substrate base 82 and in FIG. 6 as space 92 on substrate base 82.

All of the mask materials, light sources, resist materials, developers and etchants, as well as the processes for using them, are well known in the art. Evaluation and measurement of the shapes and spaces may be made by optical microscopy (for latent images) or optical or scanning electron microscopy (for developed images).

Figure 7:
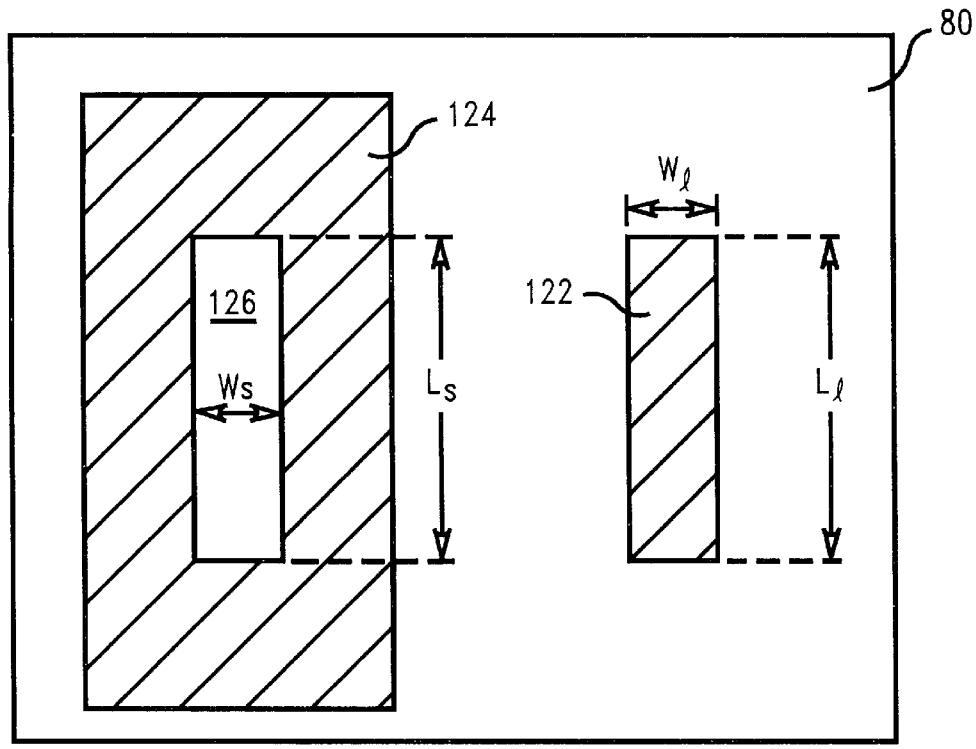
FIG. 7 is a plan view of an embodiment of complementary rectangular shape (opaque) and space (transparent) latent and developed image patterns on the resist layer of a substrate made from the mask of FIG. 1.
Figure 8:
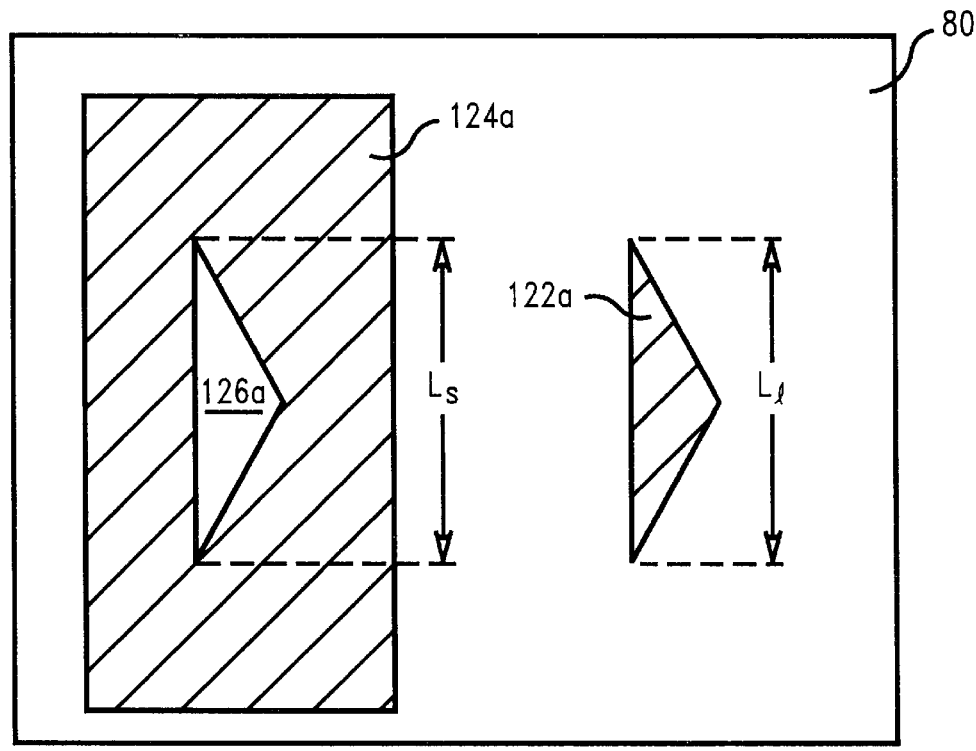
FIG. 8 is a plan view of an embodiment of complementary triangular shape (opaque) and space (transparent) latent and developed image patterns on the resist layer of a substrate made from the mask of FIG. 2.

The latent and developed images formed in the resist film material are shown in FIGS. 7 and 8. In FIG. 7, rectangular latent image 122 is formed on substrate 80 which corresponds to the rectangular opaque area 22 in FIG. 1. Likewise, latent image 124, corresponding to opaque mask area 24, has rectangular space 126 corresponding to rectangular transparent area 26. After developing, the latent images result in developed resist image areas of the same shape and configuration as on substrate 80. Rectangular developed resist shape 122 is disposed on a background free of resist material on the right hand portion of substrate 80. The length and width of developed image 122 are shown as $L_l$ and $W_l$, respectively. Complementary rectangular area 126 is free of resist material in the background of resist material 124. The length and width of developed image space 126 are shown as $L_s$ and $W_s$, respectively. The complementary shapes and spaces utilized in the present invention should have corresponding dimensions, i.e., there should be at least one dimension on a shape which can be related to a dimension on a space. For example, the dimension on the shape may be a multiple of the corresponding dimension on the space. Shape 122 and space 126 may also be of equal size.

In FIG. 8, triangular latent image 122a on substrate 80 corresponds to triangular opaque mask area 22a in FIG. 2, and after developing, produces triangular resist material area 122a of length $L_l$ on a background free of resist material. Latent image 124a with triangular space 126a corresponds to opaque mask area 24a in FIG. 2 and, after developing, produces a triangular area 126a free of resist material of length $L_s$ on a background of resist material 124a. Triangular space 126a free of resist material is complementary to triangular area 122a of resist material.

In order to distinguish between the complementary patterns, "shape" when used in connection with a latent image or resist layer will refer to: i) an area of a latent image which has an exposure dose below the resist threshold of the resist film, or ii) after development of the latent image, the area of resist material which remains on the substrate and is surrounded by an area free of resist material. The terms shape, line and island have equivalent meanings as used herein. "Space" when used in connection with a latent image or resist layer will refer to: i) an area of a latent image which has an exposure dose above the resist threshold of the resist film, or ii) after development of the latent image, the area on the substrate which is free of resist material and is surrounded by an area of resist material. The terms space, trench and trough have equivalent meanings as used herein. Contact refers to the case where the dimensions of the space are approximately equal in X and Y directions. Since positive and negative resist materials react opposite to one another when subjected to exposure doses above and below the resist threshold, the above definition, when applied to positive resist materials will be reversed when applied to negative resist materials. Throughout this specification, examples and discussion will be of positive resist material, unless otherwise noted.

It has been found that, in the regime of interest for controlling lithographic patterning, the dimensions of latent image or resist shapes and latent image or resist spaces change in opposite directions with exposure dose. Exposure dose is the combination of time of exposure of the aerial image on the resist film and the intensity of the light source utilized. That is, as the exposure dose is reduced, the length of the latent image or resist space decreases as compared to the true or nominal length of the latent image or resist space which would have been created under ideal exposure dose. The unexposed area within a latent image or the resist shape is simultaneously increased in dimension with decreasing exposure dose by the illumination source, as compared to the dimension of the shape under ideal exposure.

With increasing exposure dose, it has been found that the dimensions of the latent image or resist space will increase, and the dimensions of the unexposed area within a latent image or the resist shape will decrease.

Unlike the changes with exposure dose, it has been found that the dimensions of the latent image and resist spaces and the dimensions of the unexposed area within a latent image and the resist shapes change in the same direction with different degrees of focus. That is, when the aerial image is defocused from optimum, the dimensions of the unexposed area within a latent image and the resist shape, and the latent image and resist space, will both either increase or decrease in dimension, or remain the same.

Focus and exposure dose parameters may be determined as a mathematical function of the measured dimensions of the latent or developed image shape and space. It has been found that by taking the difference and sum of complementary tone line-length or other dimensions of the latent image or resist pattern, the effect of exposure dose and focus variation can be determined. Specifically, by taking the difference of a dimension of the complementary latent image shapes and spaces, or, preferably, the complementary resist shapes and resist spaces, the effect of exposure dose can be determined. By taking the sum of the dimensions of the complementary latent image shape and space, or, preferably, the resist shape and resist space, the variation in focus can be determined.

In each case, actual measurements are made of the corresponding dimensions of the latent image shape and space, or the resist image shape and space, on the substrate. These measured dimensions are compared with each other for the same or corresponding dimension. For example, in comparing the complementary patterns of the latent image or resist images in FIG. 7, $L_l$ will be compared to $L_s$, and $W_l$ will be compared to $W_s$. In order to facilitate comparison, the nominal complementary dimensions in the shapes and spaces to be measured should be identical or some known relationship to each other, as established by their nominal values. For example, under ideal exposure and focus conditions, $L_l$ equals $a \times L_s$, and $W_l$ equals $b \times W_s$. Likewise, in comparing the complementary patterns of the latent image or resist images in FIG. 8, $L_l$ will be compared to $L_s$.

Ideally, in the case of measuring exposure dose, the difference between the measured dimensions of the latent image or the resist shape, on one hand, and the measured dimensions of the latent image space or the resist space, on the other hand, will be a predetermined target value. This target value may be any value, positive, negative or zero. For example, where the dimensions of the shape and space on the mask are equal (or nearly equal), the target value of the difference of the resist shape and space could be zero. An acceptable tolerance about the target value may be determined by experimentation to mark the regime over which exposure dose variation is acceptable. However, for a difference in measured dimension outside that predetermined tolerance, one would then change the exposure dose in order to correct the variation in the dimensions between the latent image or resist shape and the unexposed area within a latent image or resist space.

In the case of controlling focus variation, the sum of the selected dimension of the shape and space are considered, and a target value is determined. For example, where the dimensions of the shape and space on the mask are equal, ideally the sum of the measured corresponding dimension of the latent image of the resist shape and resist space could be twice the dimensions of the nominal dimension of the shape or space under perfect focus conditions. In this example, if one were to subtract from the sum of the measured dimensions of the latent image or resist shape and the latent image or resist space twice the nominal dimension, the target value could be zero. However, an acceptable tolerance about the target value may be determined by experimentation to be acceptable for focus variations. If this determined value is outside the predetermined tolerance, then steps may be taken to modify or change the focus of the aerial image on the resist film.

It has also been found that measurement of line lengths and in particular, measurement of the distance between tapered ends of a resist shape or space are more sensitive to dose and focus variations than the widths of the resist shapes or spaces. This indicates that measurements of lengths of complementary shapes such as latent image or resist shape 122a and latent image or resist space 126a (FIG. 8) having tapered ends would tend to determine changes in length with exposure and focus more precisely.

Figure 9:
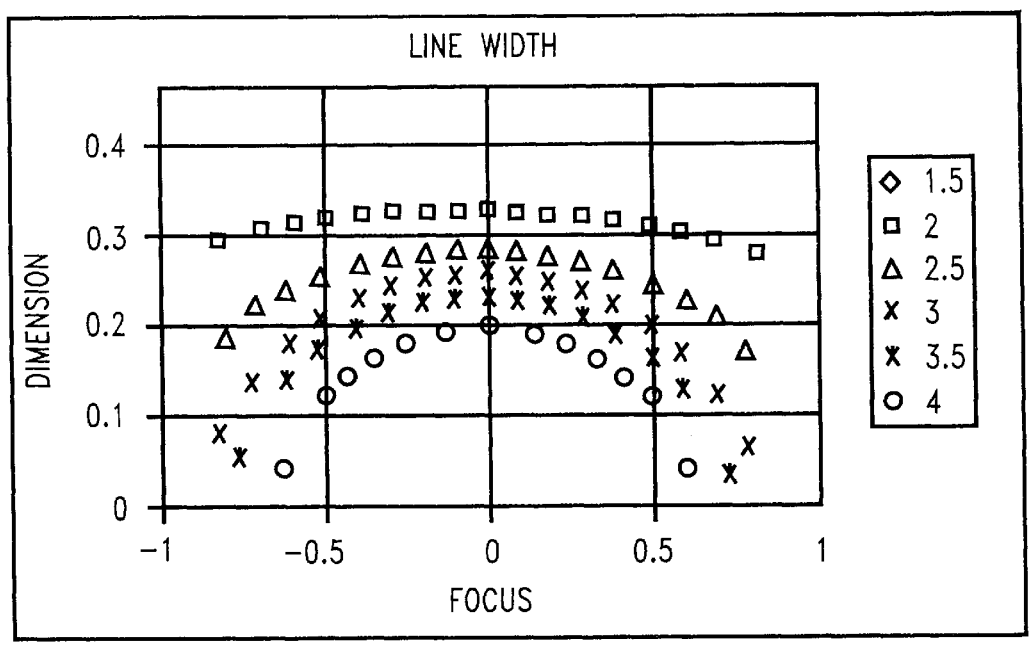
FIG. 9 is a plot of measured line (shape) widths as a function of focus under different exposures, for a nominal line width of the type shown in FIG. 7 of 0.3 microns.
Figure 10:
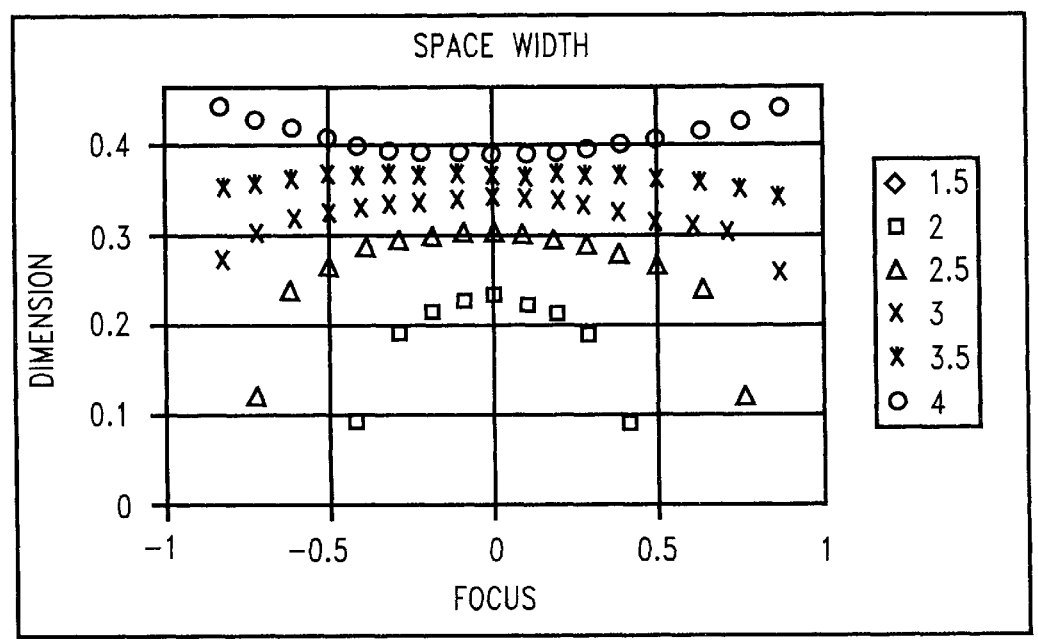
FIG. 10 is a plot of measured space widths as a function of focus under different exposures, for a nominal space width of the type shown in FIG. 7 of 0.3 microns.
Figure 11:
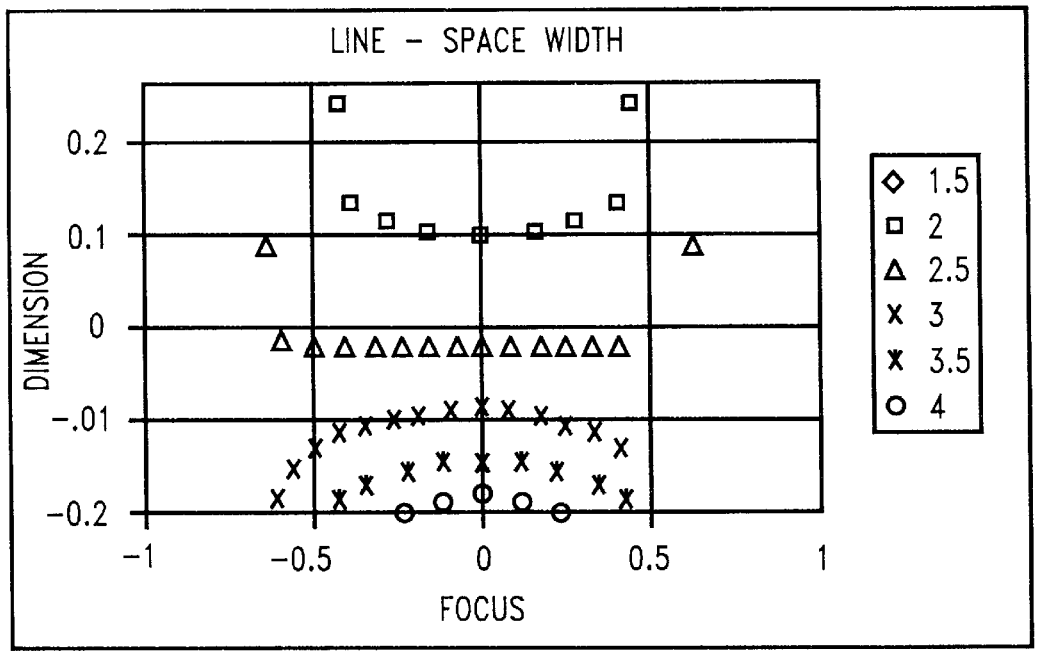
FIG. 11 is a plot of the difference of measured line and space widths shown in FIGS. 9 and 10, as a function of focus.
Figure 12:
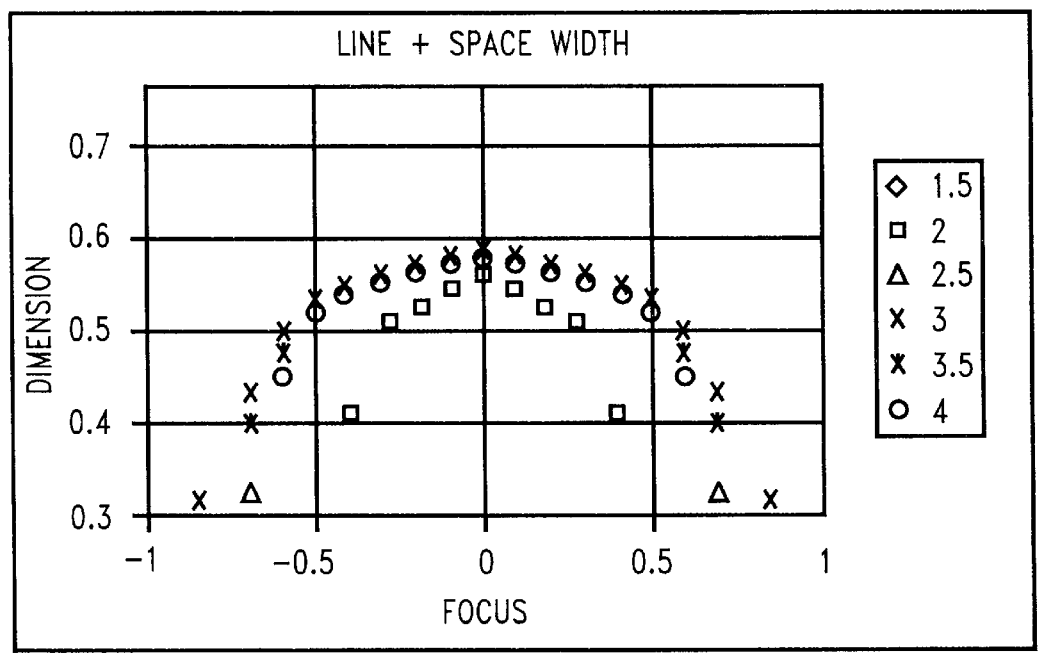
FIG. 12 is a plot of the sum of measured line and space widths shown in FIGS. 9 and 10, as a function of focus.

FIGS. 9–16 depict simulations of response to measurement of selected corresponding dimensions on complementary tone patterns. The units of dimension and focus are in microns, and the legend for the plotted points is the unitless ratio of exposure dose/dose to clear (i.e., the dose required to clear an unpatterned area on the substrate). FIGS. 9 and 10 show the measurement of line (shape) widths and space widths, respectively, of complementary resist shapes and spaces of the type shown in FIG. 7 as a function of focus, where the nominal width $W_l$ equals the nominal width $W_s$ equals 0.3 microns. FIGS. 11 and 12 show the difference and sum, respectively, of the above complementary resist shape and space width dimensions as a function of focus.

Figure 13:
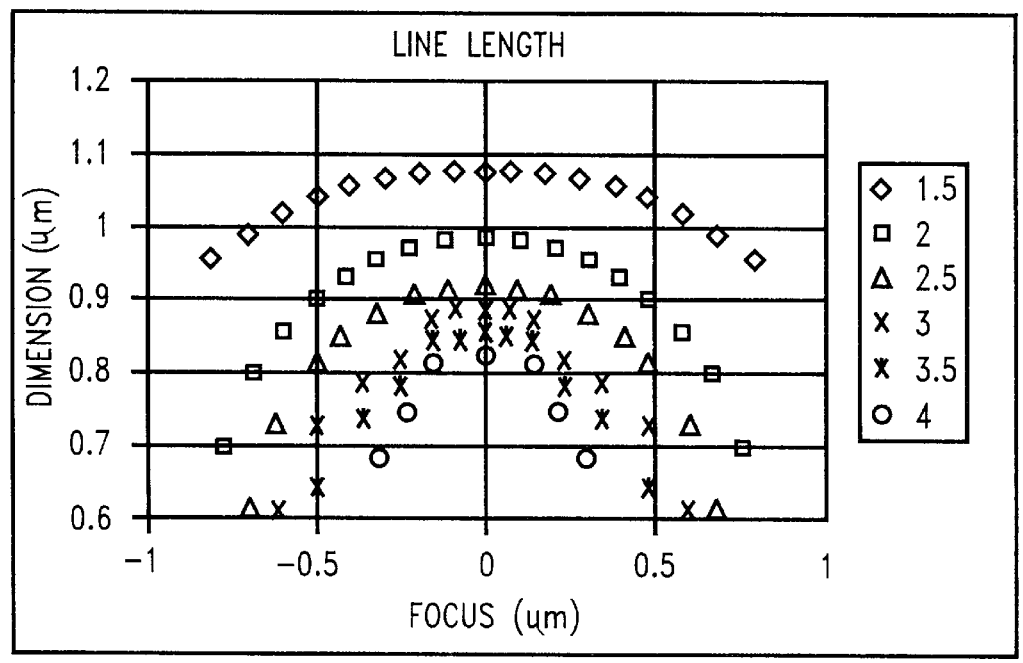
FIG. 13 is a plot of measured line lengths as a function of focus under different exposures, for a nominal line length of the type shown in FIG. 7 of 1 micron.
Figure 14:
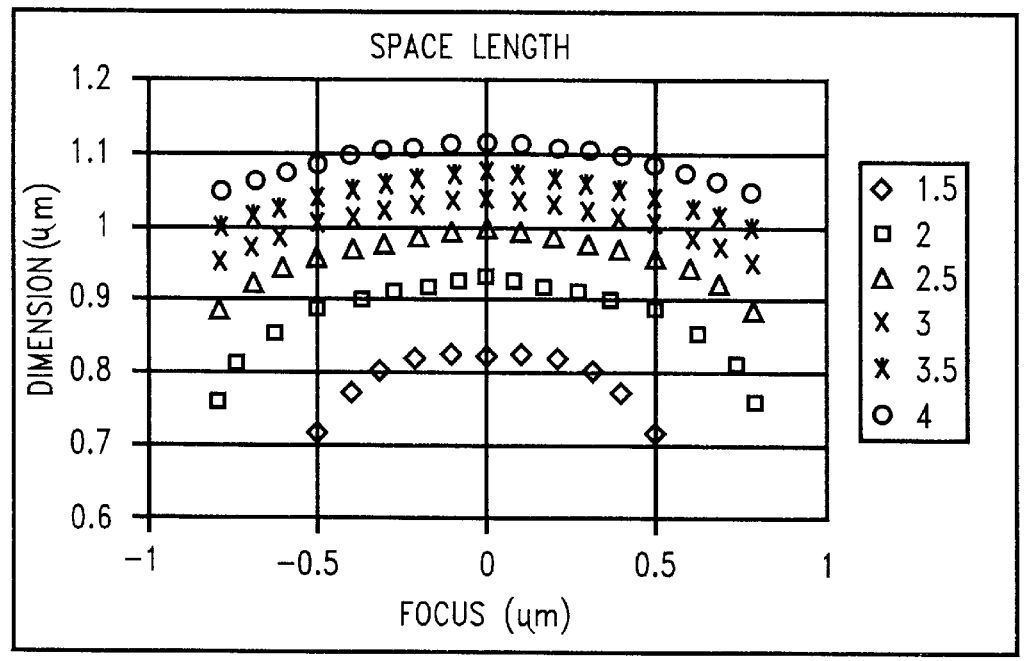
FIG. 14 is a plot of measured space lengths as a function of focus under different exposures, for a nominal space length of the type shown in FIG. 7 of 1 micron.
Figure 15:
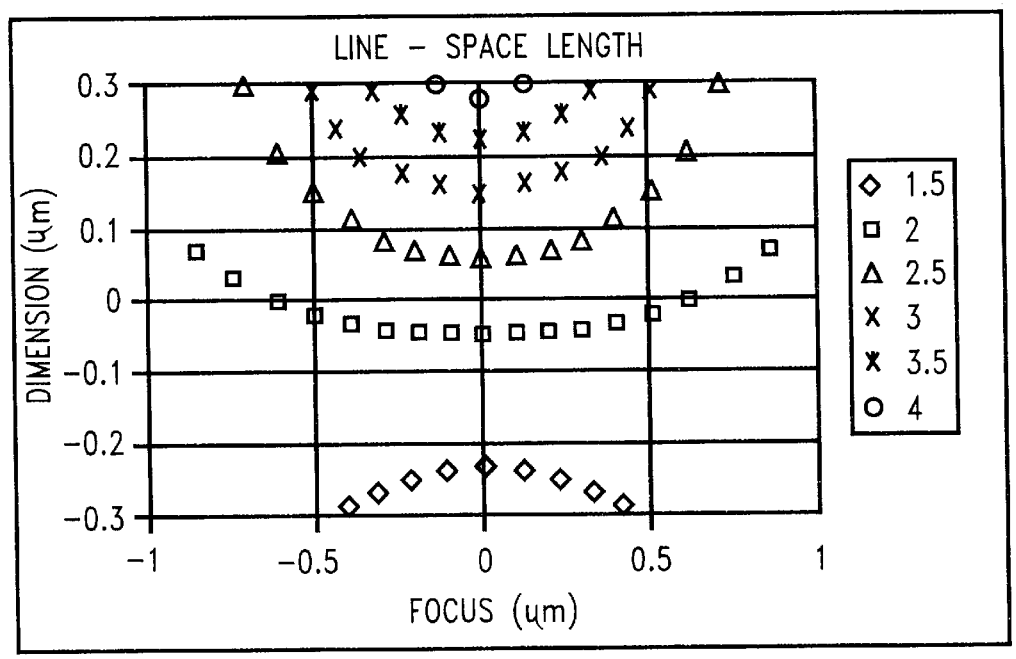
FIG. 15 is a plot of the difference of measured line and space lengths shown in FIGS. 13 and 14, as a function of focus.
Figure 16:
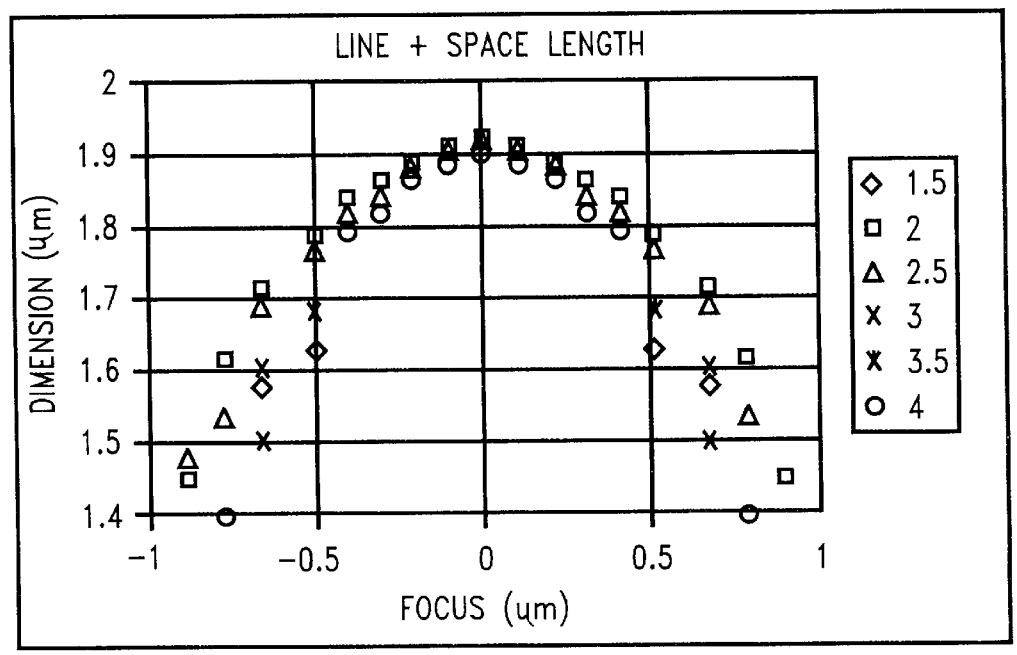
FIG. 16 is a plot of the sum of measured line and space lengths shown in FIGS. 13 and 14, as a function of focus.

FIGS. 13 and 14 show the measurement of line (shape) lengths and space lengths, respectively, of complementary resist shapes and spaces of the type shown in FIG. 7 as a function of focus, where the nominal length $L_l$ equals the nominal length $L_s$ equals 1 micron. FIGS. 15 and 16 show the difference and sum, respectively, of the above complementary resist shape and space length dimensions as a function of focus.

Accordingly, in controlling focus or exposure dose parameters in the lithographic process, the steps to be taken are preferably as follows:

1) Providing a substrate on which is deposited a layer of resist material having a resist threshold.
2) Illuminating and exposing onto the resist a complementary tone pattern having a shape which corresponds to an area on the resist film having an exposure dose below the resist threshold a space which corresponds to an area on the resist film having an exposure dose above the resist threshold. The shape and space have corresponding dimensions which have a known relationship to each other.
3) Creating on the resist film latent images of the complementary tone shape and space and, optionally, developing the latent image shape and space.
4) Measuring the corresponding dimensions on the latent or developed image shape and space.
5) Determining the adequacy of focus or exposure dose parameters as a function of the measured dimensions of the latent or developed image shape and space.

Additionally, it is advantageous to create an exposure/focus matrix of the type shown in FIGS. 9–16 which maps measured line and space widths and measured line and lengths, along with the sum and difference of these widths and lengths, as a function of focus and exposure parameters. When it becomes necessary to adjust focus or exposure dose on a product substrate, these relationships can be used to calibrate the adjustment of the exposure and/or focus parameters.

It has also been determined that the results of lithographic pattern etching can also be found to differ depending on the sum or difference of dimensions in complementary etched patterns. That is, the dimensions of etched shapes or etched spaces change in opposite directions with etching time and rate whereas only more fundamental changes in the etching process will cause them to vary in the same direction. These fundamental etch process changes include effects that deposit etch materials on the sidewalls, and what is typically characterized in the art as "polymerization".

Figure 17:
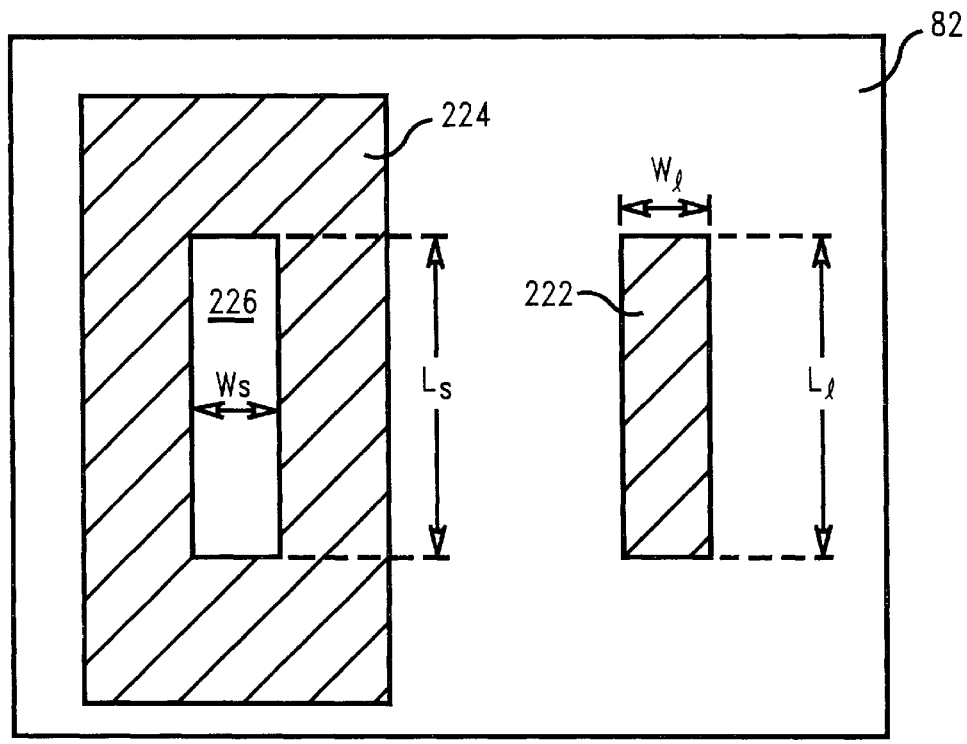
FIG. 17 is a plan view of an embodiment of complementary rectangular shape (opaque) and space (transparent) etched image patterns on the resist layer of a substrate made from the mask of FIG. 1 and latent and developed images of FIG. 7.
Figure 18:
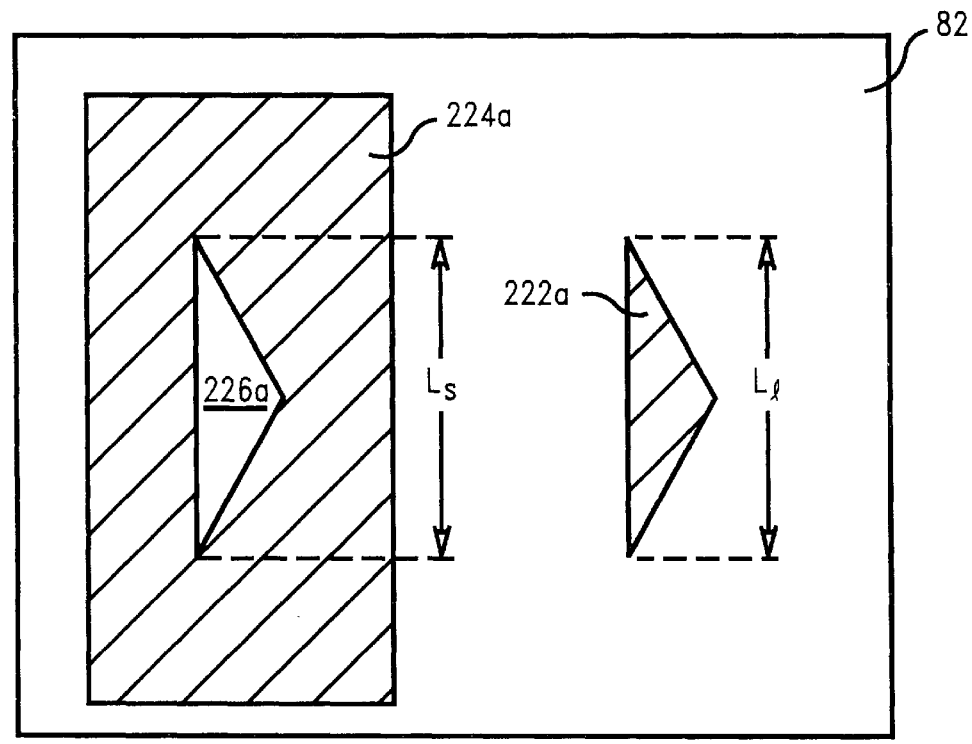
FIG. 18 is a plan view of an embodiment of complementary triangular shape (opaque) and space (transparent) etched image patterns on the resist layer of a substrate made from the mask of FIG. 2 and latent and developed images of FIG. 8.

For example, after etching the resist shapes and spaces shown in FIG. 7, the raised etches images 222 and 224 are shown in FIG. 17 remaining on the base 82 of the substrate. "Shape" when used in connection with an etched image refers to an area of an etched image which has not been removed from the substrate and is bounded by an area from which substrate material has been removed. Shapes can also be referred to as lines. "Space" when used in connection with an etched image refers to an area of an etched image which has been removed from the substrate and is bounded by an area from which substrate material has not been removed. Spaces can also be referred to as trenches. Etched image shape 222 corresponds to resist shape 122, and etched image space 226 corresponds to resist space 126. The width and length of the etched shape 222 are $W_l$ and $L_l$, respectively. The width and length of the etched space 226 are $W_s$ and $L_s$, respectively. Likewise, in FIG. 17 there is shown the raised etched images 222a and 224a which remain after etching the corresponding resist images in FIG. 7. The length of the etched shape 222a is $L_l$ and the length of the etched space 226a is $L_s$.

Etch time and other etching parameters sensitive to the differential etch rate of the different tone patterns may also be determined as a mathematical function of the measured dimensions of the etched image shape and space. By taking the sum and difference of complementary tone line length pattern dimensions in the etched pattern shapes and spaces, the effects of etch time and rate variation can be segregated from more fundamental changes in the etch process. Specifically, by taking the difference in the dimensions of the etched shapes and etched spaces, the effect of etch time and rate variations can be determined. By taking the sum of the measured dimensions of the etched shapes and etched spaces, other and more fundamental changes in the etched process can be determined, such as a change in the differential etch rate of the different tone patterns. The use of measurable complementary tone line-length pattern on product wafers, enables the implementation of a patterning control system where exposure dose and etched time/rate variations can be corrected, and detrimental changes in focus and etch conditions can be determined.

As with measurement of latent image or resist shapes and spaces, actual measurements are made of the corresponding dimensions of the etched image shape and space on the substrate base. These measured dimensions are compared to with each other for the same or corresponding dimension. For example, in comparing the complementary patterns of the etched image or resist images in FIG. 17, $L_l$ will be compared to $L_s$, and $W_l$ will be compared to $W_s$. In order to facilitate comparison, the nominal complementary dimensions in the shapes and spaces to be measured should be identical or some known relationship to each other, as established by their nominal values. For example, under ideal exposure and focus conditions, $L_l$ equals $c \times L_s$, and $W_l$ equals $d \times W_s$. Likewise, in comparing the complementary patterns of the etched image or resist images in FIG. 18, $L_l$ will be compared to $L_s$.

Under ideal conditions, the difference between the measured dimensions of the etched image shape and the measured dimensions of the etched image space will be a predetermined target value. This target value may be any value, positive, negative or zero. For example, where the dimensions of the resist image shape and space are equal (or nearly equal), the target value of the difference of the etched image shape and space could be zero. An acceptable tolerance about the target value may be determined by experimentation to mark the point at which etch time and rate variations is acceptable. However, for a difference in measured dimension outside that predetermined tolerance, one would then change the etch time and rate in order to correct the variation in the dimensions between the etched image shape and the etched image space.

In the case of controlling other etch process parameters, such as the differential etch rate of the different tone patterns, the sum of the selected dimension of the shape and space are considered, and a target value is determined. For example, where the dimensions of the shape and space on the resist are equal, the sum of the measured corresponding dimension of the etched image shape and etched image space could be twice the dimensions of the nominal dimension of the shape or space under perfect etch process conditions. In this example, if one were to subtract from the sum of the measured dimensions of the etched image shape and the etched image space twice the nominal dimension, the target value could be zero. However, an acceptable tolerance about the target value may be determined by experimentation to be acceptable for other etch process variations. If this determined value is outside the predetermined tolerance, then steps may be taken to modify or change the other etch process parameters.

To control time and other etching parameters in the process, the steps to be taken are preferably as follows:

1) Providing a substrate having an overlying resist film layer with a complementary tone developed image pattern having a developed image shape made of the resist film and a developed image space removed from the resist film. The developed image shape and space have corresponding dimensions.

2) Contacting the developed image shape and space with an etchant for a desired time to create an etched image of the developed image shape and an etched image of said developed image space on said substrate.

3) Measuring the corresponding dimensions on the etched image shape and space.

4) Determining time or other etching parameters as a function of the measured dimensions of the etched image shape and space.

As with the exposure/focus adjustment, it is advantageous to create an etching time matrix of the type shown in FIGS. 9–16 for exposure and focus which maps measured line and space widths and measured line and lengths, along with the sum and difference of these widths and lengths, as a function of etching time and other etching parameters. When it becomes necessary to etching time and other etching parameters on a product substrate, these relationships can be used to calibrate the adjustment of the respective parameters.

Figure 19:
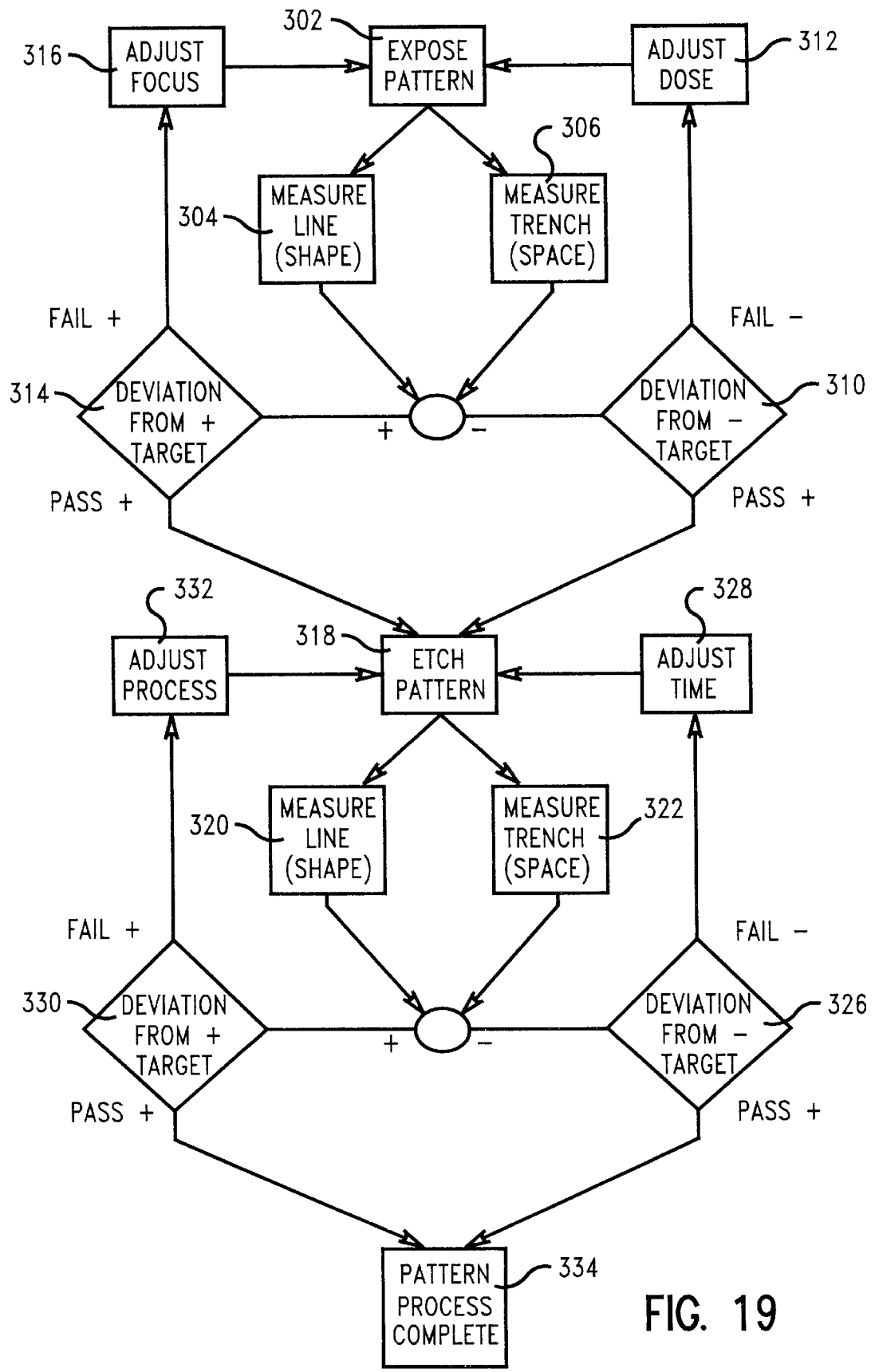
FIG. 19 is a flow diagram of the combined preferred processes of the present invention.

The preferred decision making flow chart for practice of the present invention is shown in FIG. 19. Initially, in step 102 the mask patterns are prepared and exposed as described previously with complementary opaque shapes and transparent spaces, in this example being of equal dimension. If the latent image shapes and spaces are to be measured, the process proceeds directly to the next step. If the resist image shapes and spaces are to be measured, the latent images are developed. In steps 304 and 306, the latent image or resist shapes and spaces are respectively measured. The sum and difference of the measurement of the latent image or resist shapes and spaces is determined in step 308. In comparing the difference in step 310, if the difference is outside a predetermined tolerance about the target value, the exposure portion of the process is deemed to fail and the exposure dose is adjusted, 312. After adjustment, the complementary mask pattern is again exposed, 302, and remeasured as before. If the difference in step 310 is within the tolerance about the target value, the exposure dose process is passed on to the next step, etching the pattern, 318.

After step 308, the sum of the measurements of the latent image or resist shapes and spaces are made, and twice the nominal dimension is subtracted. In comparing this value in step 314, if the value is outside a predetermined tolerance about the target value, the focus portion of the process is deemed to fail and the focus dose is adjusted, 316. After adjustment, the complementary mask pattern is again exposed, 302, and remeasured as before. If the value in step 314 is within the tolerance about the target value, the focus process is passed on to step 118, etching the pattern.

The complementary pattern is etched and the etched shapes and spaces are measured in steps 320 and 322, respectively. The sum and difference of the measurement of the etched shapes and spaces is determined in step 324. In comparing the difference in step 326, if the difference is outside a predetermined tolerance about the target value, the etch time and rate portion of the process is deemed to fail and the time and rate are adjusted, 328. After adjustment, the complementary resist pattern is again etched, 318, and remeasured as before. If the difference in step 326 is within the tolerance about the target value, the etch time and rate process is passed and this portion of the process is deemed complete.

After step 324, the sum of the measurements of the etched image shapes and spaces are made, and twice the nominal dimension is subtracted. In comparing this value in step 330, if the value is outside a predetermined tolerance about the target value, other portions of the etch process are deemed to fail and the other portions are adjusted, 332. After adjustment, the complementary resist pattern is again etched, 318, and remeasured as before. If the difference in step 330 is within the tolerance about the target value, the other portions of the etch process are deemed complete.

In the above description of the processes of the present invention for first controlling lithographic parameters (focus and exposure parameters) and then etching parameters (time and other parameters), the lithographic parameters have been corrected to obtain a resist shape and space of a desired tolerance prior to commencing etching. It is also possible to use the etching process to correct or compensate for excessive tolerances in the lithographic tolerances. For example, if it were determined that the exposure parameter in the lithographic process was outside the predetermined tolerance, rather than correcting the exposure parameter directly, a compensation may be made in the etching process to overcome the defect in the exposure. In this manner, knowledge of the nature of the lithographic problem may be employed to make the correction in the subsequent etching step, rather than repeating the lithographic processing to correct the problem.

Preferably, the dimensions of the shapes and spaces of the latent/developed images and etched images are larger than the resolution of the metrology tool employed. The minimum dimensions employed, such as for the width of isolated or nested lines or trenches (when significantly less than the lengths of the lines or trenches), may be on the order of the minimum feature size of the circuit pattern.

By following the aforementioned methods, the present invention provides a test pattern and evaluation method for determining exposure and focus conditions, as well as a test pattern and evaluation method for determining etching time and rate conditions and other etching process conditions. For each method, one pattern group is capable of distinguishing between either exposure and focus problems, or between etching time and rate problems and other etching process problems in semiconductor pattern processing. The present invention may be used with existing metrology instruments and exposure and etching equipment, and, further, is easy and inexpensive to utilize.

Even for the simulated examples shown in FIGS. 11, 12 and 15, 16, it has been found that the difference and sum of the shape and space dimensions do not completely separate the dose and focus dependence over the entire dose and focus regime. The difference plots in FIGS. 11 and 15 show increasing focus dependence as the dose deviates from an "isofocal" value at which the difference dimension is independent of focus. The sum plots in FIGS. 12 and 16 show some separation of the curves with changing dose, particularly at extremes of defocus.

In practice, the behavior of spaces and shapes with exposure dose and focus may follow even more dissimilar curves than those of the simulated examples. Observed differences in the relative sensitivity to dose and focus, and even in the position of optimum focus, of nominally identical spaces and shapes can be ascribed to the non linear characteristics of the lithography and etch process. Some examples of specific contributing factors are:

1. For a given pattern level it may be desirable to operate in an overexposed or underexposed condition relative to the dose condition that replicates the mask dimension. This can shift the dose operating point to a region of the focus-exposure plane where spaces and shapes have different sensitivity to dose variation.

2. Characteristics of the mask, such as the relative size or corner rounding attributes of spaces and shapes, can cause differences in their dose and defocus sensitivity.

3. Characteristics of the resist, such as contrast and exposure latitude.

4. Characteristics of the aerial image produced by the exposure tool, such as flare.

5. Characteristics of the etch process, such as sensitivity to local pattern density.

Under conditions where the shapes and spaces exhibit significantly different sensitivities, a more sophisticated approach to the separation of dose, focus and etch variables may be required than a simple sum and difference of the respective dimensions.

Figure 20:
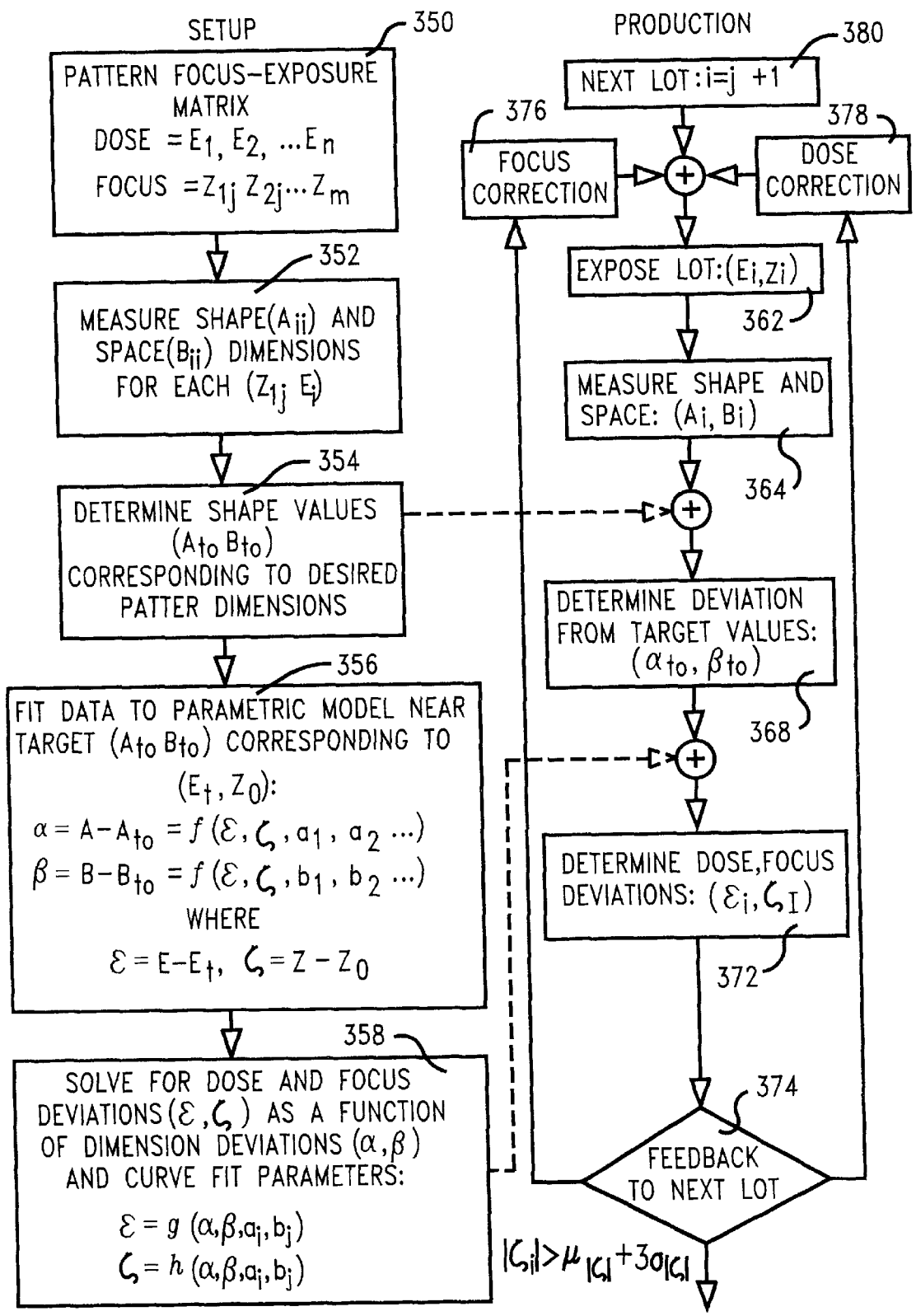
FIG. 20 is a flow diagram of a manufacturing control system utilizing tone reversed patterns of the present invention to control focus and exposure dose settings.

A flowchart of an improved feature size control system using tone reversed patterns is shown in FIG. 20, which is directed to the exposure dose and focus characteristics of the lithography. The process is first characterized by printing a complementary tone reversing pattern under a series of different exposure and focus conditions 350. For each ($E_i$, $Z_j$) combination, the shape ($A_{ij}$) and space ($B_{ij}$) dimensions are measured, 352. The target values ($A_{to}, B_{to}$) are determined by correlation to the desired dimensions of the circuit pattern (box 354). At the optimum focus $Z_o$ determined as the point at which the rate of change of A and B with z is minimum, the target values must correspond to a single value of dose, $E_i$.

In box 356, the dependence of the shape and space dimensions on dose and focus in the neighborhood of the target values ($A_{to}, B_{to}$ and $E_t, z_o$) are modeled by a set of parametric equations:

$$\alpha = f(\epsilon, \zeta, a_1, a_2, \ldots) \quad (1)$$

$$\beta = f(\epsilon, \zeta, b_1, b_2, \ldots)$$

where $\alpha, \beta, \epsilon$ and $\zeta$ are defined as deviations from the target values:

$$\alpha = A - A_{to}, \beta = B - B_{to}, \epsilon = E - E_t \text{ and } \zeta = z - z_o.$$

For examples, the equations:

$$\alpha = a_1 \zeta^2 + a_2 \epsilon \quad (2)$$

$$\beta = b_1 \zeta^2 + b_2 \epsilon$$

are used to capture the case where the exposure dose sensitivity (represented by slope parameters $a_2$, $b_2$) and defocus sensitivity (represented by curvature parameters $a_1$, $b_1$) differ between the shape and space patterns. The parameters ($a_1, a_2, \ldots$) and ($b_1, b_2, \ldots$) may be determined by a conventional least-squares fit to the measured dose-focus data.

Once the parameters have been established by fit to the model, the set of equations (1) can be used to solve (box 358) for the dependence of dose and focus on the shape and space dimensions:

$$\epsilon = g(\alpha, \beta, a_1 \ldots a_n, b_1 \ldots b_n) \quad (3)$$

$$\zeta = h(\alpha, \beta, a_1, \ldots a_n, b_1 \ldots b_n) \quad (4)$$

For the example given by equation (2), equations (3) and (4) can be expressed analytically as:

$$\epsilon = (b_1 \alpha - a_1 \beta)/(a_2 b_1 + a_1 b_2) \quad (5)$$

$$\zeta^2 = (b_2 \alpha + a_2 \beta)/(a_2 b_1 + a_1 b_2) \quad (6)$$

For more complex models (1) than the example (2), an analytic solution may not be possible and numerical methods must be employed to solve for $\epsilon$ and $\zeta$. In the simpler case where the dose and focus sensitivity of shapes and spaces are identical, namely $b_1 = a_1$, and $b_2 = a_2$, then equations (5) and (6) reduce to the simple sum and difference expressions:

$$\epsilon = (\alpha - \beta)/(2 a_2) \quad (7)$$

$$\zeta^2 = (\alpha + \beta)/(2 a_1) \quad (8)$$

The underlying physics of the shape and space dependence on dose and focus dictates that the more sophisticated expressions for dose and focus deviation in Equations (3) and (4), will behave as modifications to the simple sum and difference expressions in Equations (7) and (8). Thus, the sum and difference paths of the control system shown in FIG. 19 may be most generally described as the "modified" sum and difference of the shape and space dimensions.

The above describes the setup method by which operating conditions of a features size control system can be established using tone-reversed patterns. This method may be used in the in-line implementation of the control system in manufacturing as follows.

The target dose and focus ($E_t$, $z_o$) determined in the setup procedure can be used to initiate the manufacturing process. Over time, the corrections required to keep product within the required dimension tolerances may cause deviations from the original target values, such that the estimated dose and focus for the (i)$^{th}$ product lot is ($E_i$, $z_i$) as shown on the right side of FIG. 20. Each production lot will have on a substrate, one or more complementary tone-reversed patterns as described previously. After exposing the lot at ($E_i, z_i$) (box 362) and measuring the shape and space of the pattern (box 364), the deviation of the tone-reversed measure values ($A_i$, $B_i$) (box 368) from their respective target values ($A_{to}$, $B_{to}$) can be substituted in the predetermined equations (3) and (4) to compute the equivalent dose and focus deviations ($\epsilon_i, \zeta_i$) (box 372). Were the exposure of the $i^{th}$ lot to be repeated, the settings ($E_i - \epsilon_i$, $Z_i - \zeta_i$) would guarantee the target dimensions ($A_{to}, B_{to}$). In practice, however, it is of more value to predict the settings to be used on the (i+1)$^{th}$ lot. In a continuously running manufacturing line, the dose can be forecast based on the variation of the last N lots. Depending on the continuity of product flow and the stability of the process, an appropriate forecasting algorithm can be derived, for example, a rolling average:

$$E_{i+1} = E_i - \frac{1}{N} \sum_{i-N}^{i} \varepsilon_i \quad (9)$$

The new setting is then fed back (box 374) to the next lot of substrates to be processed (box 380), and a correction to the focus (box 376) or exposure dose (box 378) is made if needed.

Since the variation of dimension is usually symmetric with defocus, there is likely to be ambiguity regarding the sign of the focus correction. Nonetheless, a statistical check of the focus deviation by the equation:

$$|\zeta| > \mu_{|\zeta|} + 3\sigma_{|\zeta|} \quad (10)$$

may be used to determine if a significant focus shift has occurred on a specific lot; where $|\zeta_i|$ is the absolute value of the computed focus shift on the $i^{th}$ lot, $\mu_{|\zeta|}$ is the mean of the absolute value of the focus shift over many lots, and $\sigma_{|\zeta|}$ is the standard deviation. Since significant focus shifts are believed to be rare, it is sufficient to be able to signal when one has occurred and to determine the sign of the correction by the conventional technique of measuring a product wafer on which focus has been intentionally varied.

Figure 21:
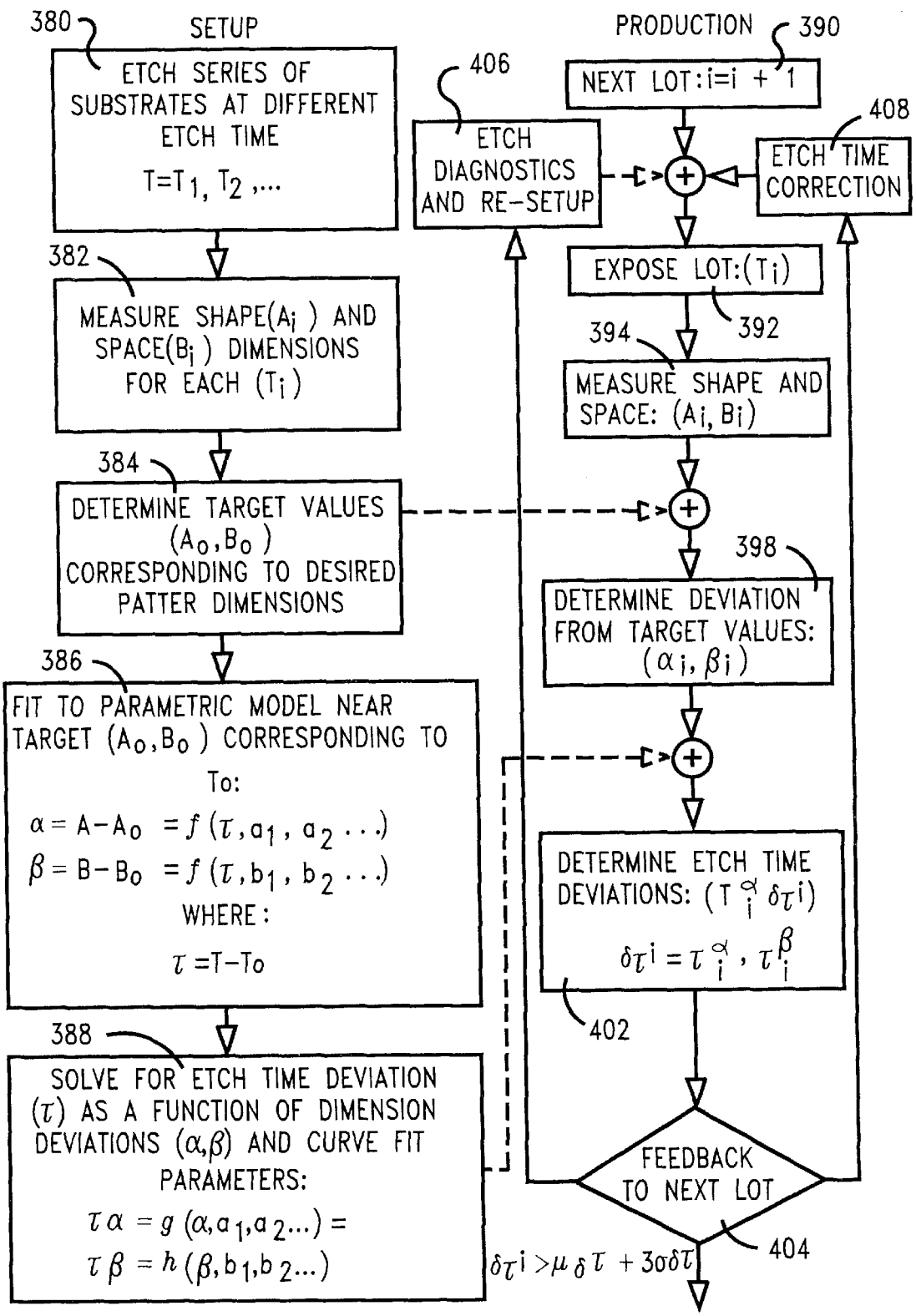
FIG. 21 is a flow diagram of a manufacturing control system utilizing tone reversed patterns of the present invention to control etching and other settings.

A method analogous to that described above and in FIG. 20 may be used to control etching and other parameters by complementary tone developed image patterns on a resist film layer on a substrate. As shown in FIG. 21, the process is first characterized by etching a complementary tone reversing pattern under a series of different etch time conditions (box 380). For each $T_i$ condition, the shape ($A_i$) and space ($B_i$) dimensions are measured, box 382. The target values ($A_o$, $B_o$) corresponding to etch time $T_o$ are determined by correlation to the desired dimensions of the circuit pattern (box 384). At the optimum etch time $T_0$ determined as the point at which the rate of change of A and B with T is minimum, the target values must correspond to a single value of dose, $T_i$.

In box 386, the dependence of the shape and space dimensions on etch time in the neighborhood of the target values ($A_o$, $B_o$ and $T_o$) are modeled by a set of parametric equations:

$$\alpha = f_e(\tau, a_1, a_2 \ldots) \tag{1a}$$

$$\beta = f_e(\tau, b_1, b_2 \ldots)$$

where $\alpha$, $\beta$, and $\tau$ are defined as deviations from the target values:

$\alpha = A - A_o$ (shape dimension)

$\beta = B - B_o$ (space dimension)

$\tau = T - T_0$ (etch time)

For examples, the equations:

$$\alpha = a_1 \tau \tag{2a}$$

$$\beta = b_1 \tau$$

are used to capture the case where the etch sensitivity (represented by slope parameters $a_1$, $b_1$) differ between the shape and space patterns. The parameters $a_1$ and $b_1$ may be determined by a conventional methods to the measured etch condition data.

Once the parameters have been established by fit to the model, the set of equations (1a) can be used to solve (box 388) for the dependence of dose and focus on the shape and space dimensions:

$$\tau^\alpha = g(\alpha, a_1 \ldots a_n) \tag{3a}$$

$$\tau^\beta = h(\beta, b_1 \ldots b_n) \tag{4a}$$

For the example given by equation (2a), equations (3a) and (4a) can be expressed analytically as:

$$\tau = \tau^\alpha = \tau^\beta = \alpha/a_1 = \alpha/b_1 \tag{5a}$$

By measuring A and B, redundant determinations are made of the etch time deviations ($\tau^\alpha, \tau^\beta$), which should be equal. If in practice they are found to differ by a statistically significant amount, there would be indicated a change in fundamental etch properties. Statistical process control methodology can be applied to $\tau^\alpha - \tau^\beta = \delta\tau$ to determine whether a significant process shift has occurred.

The target etch time ($T_o$) determined in the setup procedure can be used to initiate the manufacturing process. Over time, the corrections required to keep product within the required dimension tolerances may cause deviations from the original target values, such that the estimated etch condition for the (i)$^{th}$ product lot is ($T_i$) as shown on the right side of FIG. 21. Each production lot will have on a substrate one or more complementary tone-reversed patterns as described previously. After etching the lot at ($T_i$) (box 392) and measuring the shape and space of the pattern (box 394), the deviation of the tone-reversed measure values ($A_i$, $B_i$) (box 368) from their respective target values ($A_o$, $B_o$) can be substituted in the predetermined equations (3a) and (4a) to compute the equivalent etch deviation ($\tau_i$) (box 402). Were the exposure of the i$^{th}$ lot to be repeated, the settings ($T_i - \tau_i$) would guarantee the target dimensions ($A_o, B_o$). In practice, however, it is of more value to predict the settings to be used on the (i+1)$^{th}$ lot. In a continuously running manufacturing line, the etch time and condition can be forecast based on the variation of the last N lots. Depending on the continuity of product flow and the stability of the process, an appropriate forecasting algorithm can be derived, for example, a rolling average:

$$T_{i+1} = T_i - \frac{1}{N} \sum_{i-N}^{i} \tau_i \tag{9a}$$

The new setting is then fed back (box 404) to the next lot of substrates to be processed (box 390), and a correction to the etch time (box 408) or etch diagnostics and re-setup (box 406) is made if needed.

The improved metrology target of the present invention uses a self-consistent design to transcend the limitations of optical microscopy. The target employs measurement of array edges instead of individual pattern elements, as discussed above.

Preferably, there is employed to provide in-line measurement of the targets of the present invention the optical imaging tool and system as disclosed in copending U.S. application Ser. No. 08/643,138 and U.S. application Ser. No. 08/919,993 entitled Optical Metrology Tool And Method of Using Same (filed on even date herewith), assigned to the assignee of the present invention, the disclosures of which are hereby incorporated by reference. Such targets on a substrate wafer consist in part of an array of parallel pattern elements or lines of length at pitch P. The pitch is matched to the minimum pitch in the chip design for a specific masking layer. The array width, $W_o$, is large relative to the minimum resolution of the metrology tool. For the particular pattern design shown, $W_o$ also corresponds to the length of the individual pattern elements. If P is below the optical resolution:

$$P < \lambda/(NA(1+\sigma)) \tag{11}$$

wherein the wavelength of the light is $\lambda$, the optical metrology tool numerical aperture is NA and partial coherence is $\sigma$, then the optical image of the array will be a featureless wide line as shown, wherein the pattern elements are unresolved in the direction of the pitch, but well resolved in the direction of the array width. Using optical microscopy in which the array pitch, numerical aperture, coherence and light wavelength are selected so that the array elements are unresolved, the image of the featureless line may be brought into focus and edge detection may be conducted by applying algorithms by a variety of well-known techniques to determine the measured width of the array A consequence of using such a target design, in which the minimum pitch is perpendicular to the measurement direction, is that the length of minimum dimension patterns is monitored, rather than their width. Line lengths tend to be significantly more sensitive to process conditions than line widths as the resolution limits of any given lithography process are approached.

An added benefit to having the target pitch perpendicular to the measurement direction is that it alleviates the need to satisfy equation 11, namely, to keep the pitch below the optical microscope resolution. The result of partially or even fully resolving the pattern elements is that the pixels along the edge of the array see a modulation in the edge position. However, on average over along length of the array this still results in a single edge position sensitive primarily to the length of the individual lines. Nonetheless, the edge acuity of the detected intensity is decreased when the lines are resolved, thus degrading the precision of the measurement. To optimize this metrology approach for semiconductor manufacturing applications, the configuration of the improved optical microscope of the present invention preferably insures that Equation 11 is met for the targets employed, such as those described above.

The target configurations can be tailored to mimic pattern layers in the manufacturing process (e.g., lines, contacts or islands), to increase the sensitivity of metrology (e.g., using tapered lines, daggers or sub-resolution patterns), and to characterize specific attributes of the lithographic process (e.g., linearity and proximity bias). The target enables optical measurement of critical dimension variation of both tones for patterning process control.

Figure 22A:
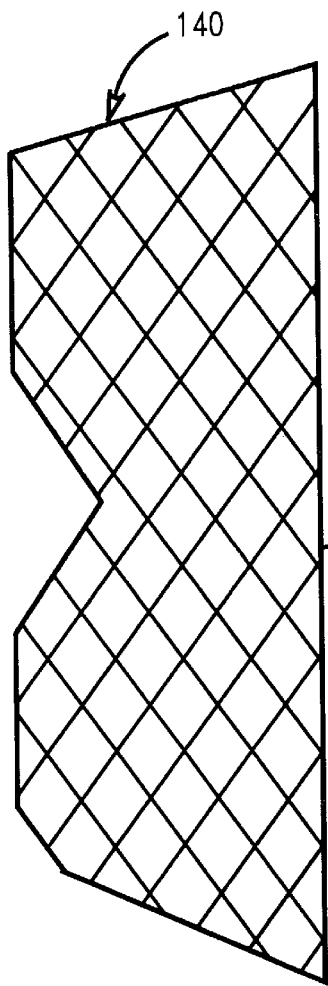
FIG. 22a is a plan view of a target comprising a single contrasting straight edge.
Figure 22B:
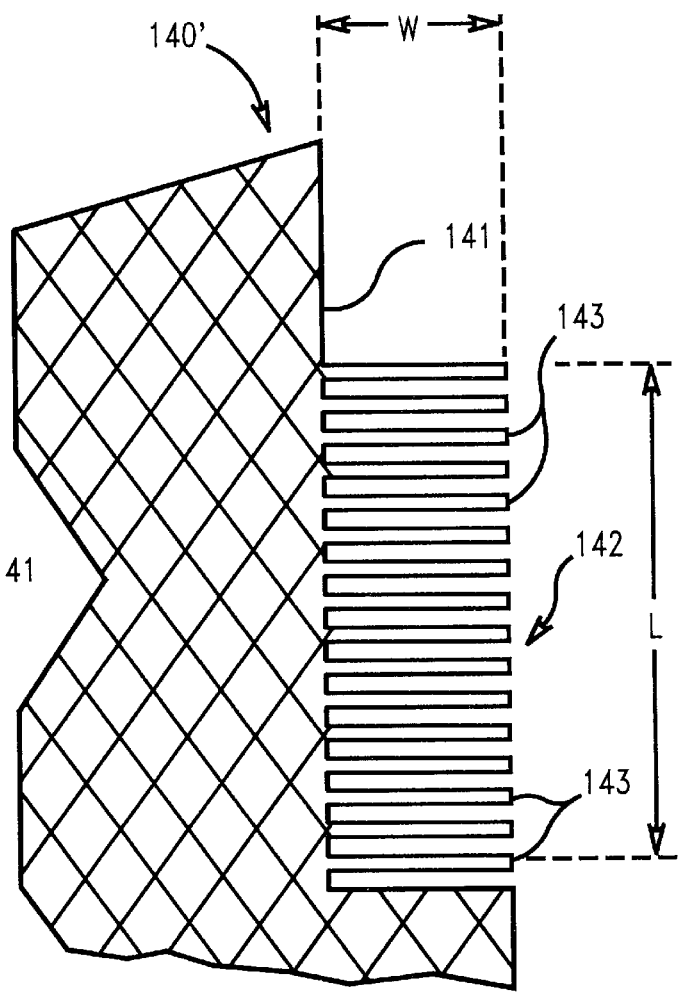
FIG. 22b shows the target of FIG. 22a having thereon a serpentine edge comprising an array of individual spaced, parallel line elements.

A first target is depicted in FIGS. 22a and 22b. The transition between a contrasting target area or island on the left) and a surrounding clear area on a substrate defines an edge 141 of an arbitrary pattern shape (FIG. 22a). The straight edge of target area 140 may be transformed to a measurable pattern by creating a serpentine edge 142 as shown in FIG. 22b. Edge 142 is created by contacting a similarly contrasting array of spaced individual elements 143 with edge 141 of target 140'. Each element 143 has length and width, with the ends of the array being formed along parallel lines (perpendicular to the length of the elements 143) forming the array edge 141, 142. The spacing (clear area) between individual elements equals the element width. The array width W is equal to the length of the elements or lines 143, and the array length L is equal to the distance between opposite far edges of the first and last of the elements 143.

Figure 23B:
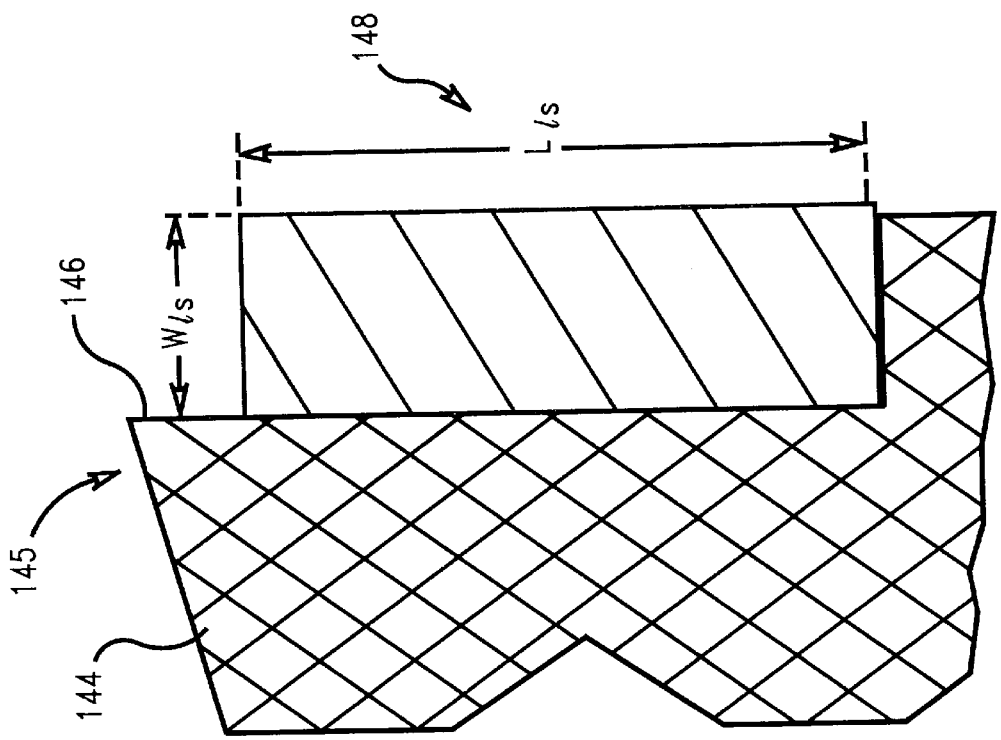
FIG. 23b depicts the target of FIG. 23a as seen when the individual array elements are not resolved.
Figure 23A:
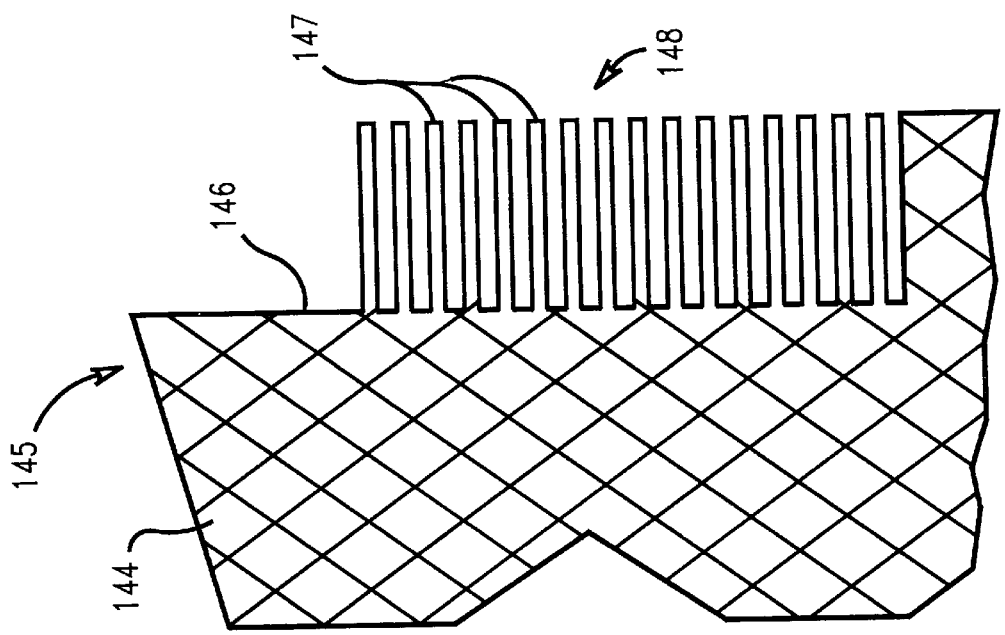
FIG. 23a is a plan view of a target similar to FIG. 22b.

Measurement of the pattern in FIG. 22b can be achieved using various metrology techniques (such as optical microscopy, scanning electron microscopy and atomic force microscopy) provided a detectable edge exists between the serpentine area and the surrounding clear areas. As shown in FIGS. 23a, a target 145 has contrasting area 144 with straight edge 146 contacting the edge of an array made up of spaced parallel lines 147. The ends of lines 147 opposite area 144 form serpentine edge 148. To measure target 145, the individual elements of the serpentine need not be well resolved. In particular, an optically measurable complementary tone pattern can be created from this serpentine edge as shown in FIG. 23b by not resolving the individual elements, where optical contrast is observed on both the line and space (144) sides of pattern 145. The dimensions of the pattern ($W_{is}$ and $L_{is}$) are focus sensitive, whereas the center of position of the pattern (X,Y) is exposure sensitive, where x is the center of array width $W_{is}$ and y is the center of array length $L_{is}$.

Figures 24, 24A, 24B:
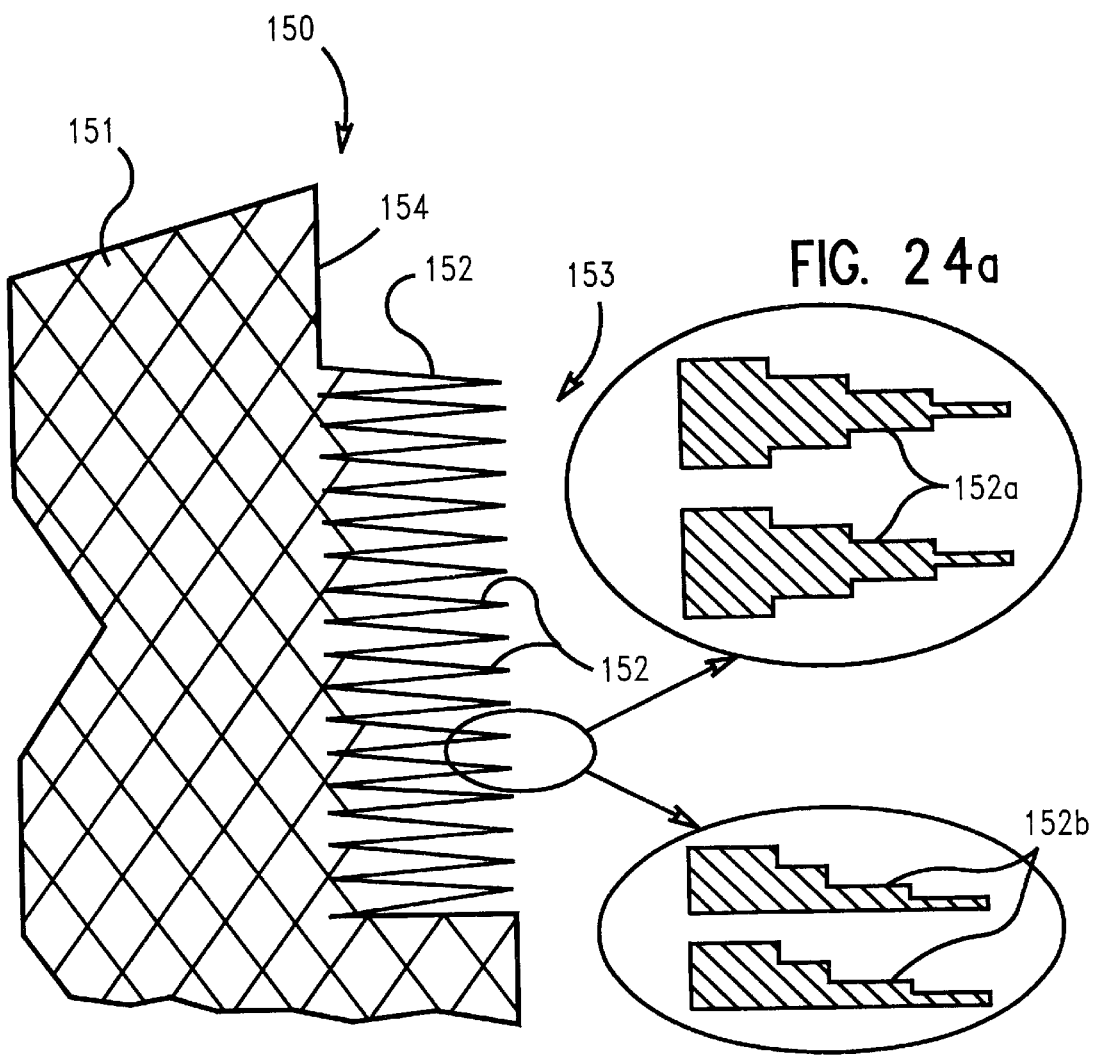
FIG. 24 depicts a target similar to FIG. 22b, except that the individual array lines are tapered.
FIG. 24a is an enlargement of one embodiment of the tapered array lines of FIG. 24.
FIG. 24b is an enlargement of another embodiment of the tapered array lines of FIG. 24.

Various compact and measurable patterns can be constructed from the basic pattern of FIGS. 22b and 23a. In FIG. 24 there is shown a tone-reversing target 150 having serpentine edge 153 made using lines 152 which taper from a width at edge 154 of contrasting area 151 down to a point at opposite array edge 153. In practice, the individual elements of the serpentine are formed by stepping the pattern in increments of the minimum design grid (typically 25 nm). A symmetrical stepping can be used for lines 152a, as shown in FIG. 24a, or a single-sided stepping can be used for lines 152b, as shown in FIG. 24b. The single stepping has the advantage that a more gradual taper is possible.

Figure 25:
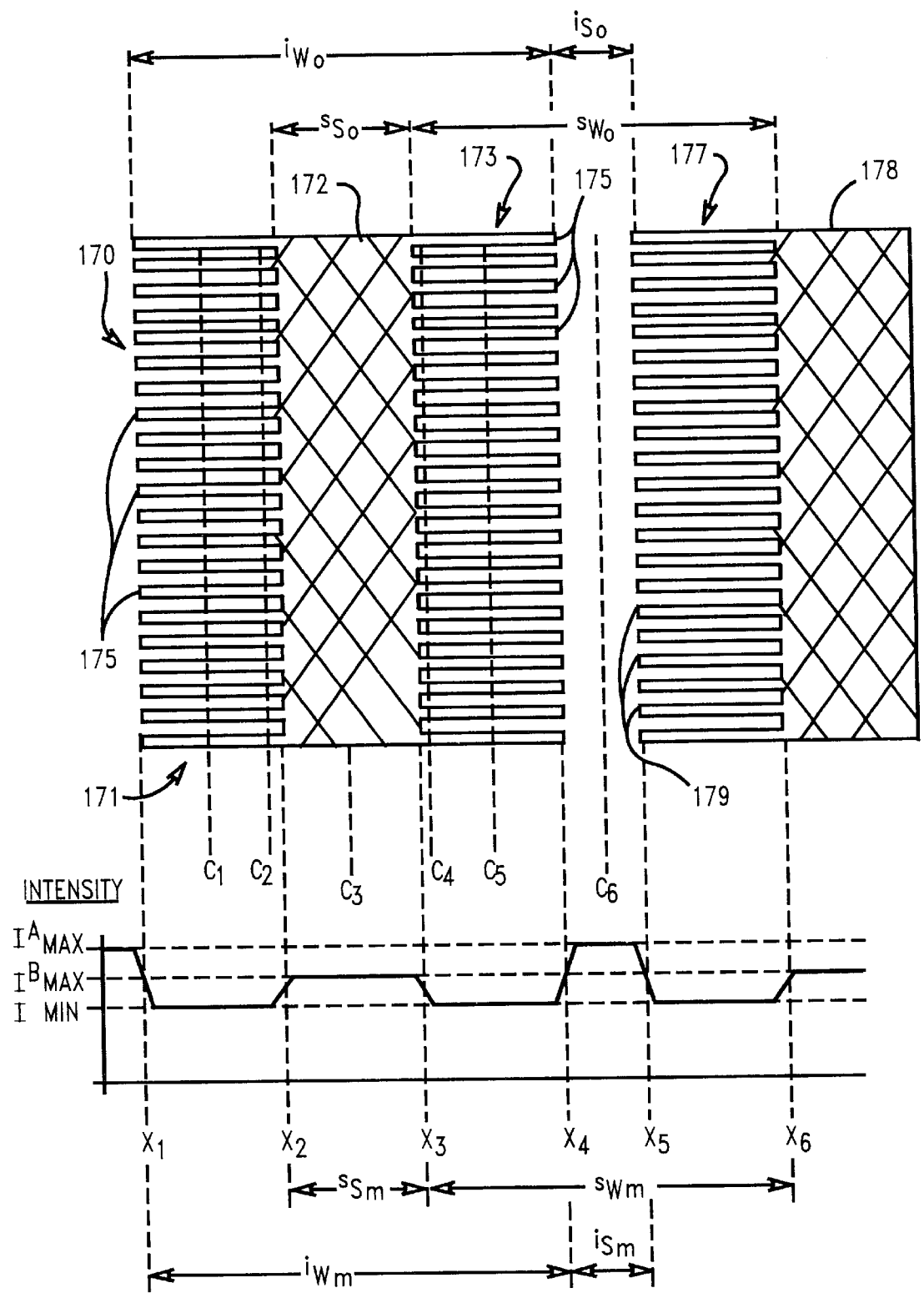
FIG. 25 is a plan view of an embodiment of a target using contrasting tone reversing arrays.

A target improvement using tone reversing arrays is shown in FIG. 25. Target 170 comprises a pair of mirror-image arrays 171, 173 of equilength parallel elements or lines (shapes) 175 in contact with and on opposite sides of a rectangular area or island (shape) 172 of the same nominal length, width and tone as arrays 171, 173. Both the lines 175 and island 172 contrast with the substrate. The location of the free edge of array 171 is shown as $x_1$, the location of the free edge of array 173 is shown as $x_4$, the location of the common edge between array 171 and island 172 is shown as $x_2$, and the location of the common edge between array 173 and island 172 is shown as $x_3$. The width of arrays 171, 173 and island 172 is given by $^iW_o$. Spaced from array 173 by a distance $^iS_o$ (nominally equal to the length of lines 175, 179) is array 177, comprising equilength parallel lines 179, in contact along an array edge with rectangular island 178 of similar nominal length and width. The location of the free edge of array 177 is shown as $x_5$, and the location of the common edge between array 177 and island 178 is shown as $x_6$.

The expression of bias and pitch as a function of the island and space edge locations enables the separation of CD response to exposure dose and/or etch time from CD response to other process variables, such as focus, film thicknesses, and substrate properties. For example, an island-to-space bias $^{is}B_m$ and pitches $^PW_m$, $^PS_m$ can be determined by the following equations:

$$^{is}B_m = {}^{-i}W_m {}^{-s}W_{m3} {}^{-s}S_m {}^{-i}S_m \qquad (12)$$

$$^PW_m = {}^{-i}W_m {}^{+s}W_m \qquad (13)$$

$$^PS_m = {}^{-i}S_m {}^{+s}S_m \qquad (14)$$

Since the island (shape) and space edges move in opposite directions with exposure dose, but in the same direction with defocus, $^{is}B_m$ is primarily sensitive to dose and insensitive to defocus, and pitches $^PW_m$, $^PS_m$ are primarily sensitive to defocus and insensitive to dose. The ability to distinguish dose and defocus dependence of CD is a key attribute of the tone reversal target.

If the island (shape) and space patterns have similar contrast when imaged in an optical microscope (for example, they are both dark with respect to the surrounding background), then changes to the perceived edge location with substrate properties will affect them approximately equally. Consequently, the dose dependent $^{is}B_m$, expressed as a difference between the two pattern widths, will be relatively insensitive to variations in the optical properties of the substrate. Because dose is the principal control parameter for CD, the ability to suppress false sensitivity to substrate properties is a second key attribute of the tone reversal target.

The preferred target may be specified by its internal pitch, P, and by its array width W. There should be adequate image contrast between the target and its surrounding area. Image contrast is a function of the wavelength and partial coherence tool parameters, and the optical properties of the patterned target, the adjacent unpatterned area and the underlying substrate. At different wavelengths, the patterned area can be brighter or darker than the surrounding area, and the bandwidth of the high contrast regions tends to be on the order of 25–50 nm. In the target depicted in FIG. 25, the contrast is determined principally by the relative reflectivity of the target and its surroundings.

For the tone reversing target, changes in target size or dimension of elements may be observed as changes in target position. This enables the measurement of critical dimension using an optical overlay metrology tool or optical alignment system. In the case of overlay or alignment metrology, it would be necessary to detect centerline shifts on a target, namely, the relative change of any pair of edge positions that define the target. In the target variations depicted in FIG. 25, both can be characterized by six types of centerlines C between edge pairs:

$$C_1 = (x_1 + x_2)/2 \tag{14}$$

$$C_2 = (x_1 + x_3)/2 \tag{15}$$

$$C_3 = (x_1 + x_4)/2 = (x_2 + x_3)/2 \tag{16}$$

$$^iW_m = x_4 - x_1 = 4C_3 - 2(C_1 + C_2) \tag{17}$$

$$^sS_m = x_3 - x_2 = 2(C_2 - C_1) \tag{18}$$

$$C_4 = (x_4 + x_5)/2 \tag{19}$$

$$C_5 = (x_3 + x_5)/2 \tag{20}$$

$$C_6 = (x_3 + x_6)/2 = (x_4 + x_5)/2 \tag{21}$$

$$^sW_m = x_6 - x_3 = 4C_6 - 2(C_4 + C_5) \tag{22}$$

$$^iS_m = x_5 - x_4 = 2(C_5 - C_4) \tag{23}$$

The edge orientation may be defined as the direction between patterned and unpatterned regions of the target. $C_1$, $C_4$ are the centerlines between edges of opposite tone oriented in opposite directions, and will be primarily sensitive to change in exposure dose (when exposing a target on a resist film) or etch time (when etching a developed target on a resist film). $C_2$, $C_5$ are the centerlines between edges of opposite tone oriented in the same direction, and will be primarily sensitive to change in focus (when exposing a target on a resist film) or sensitive to the differential etch rate of the different tone patterns (when etching a developed target on a resist film). $C_3$, $C_6$ are the centerlines between edges of the same tone oriented in the same or opposite directions. Since both edges have the same sensitivity to feature size, it will be independent of exposure dose or focus (when exposing a target on a resist film) or etch parameters (when etching a developed target on a resist film). Consequently, $C_3$, $C_6$ may be used for conventional overlay or alignment measurement.

Figure 26A:
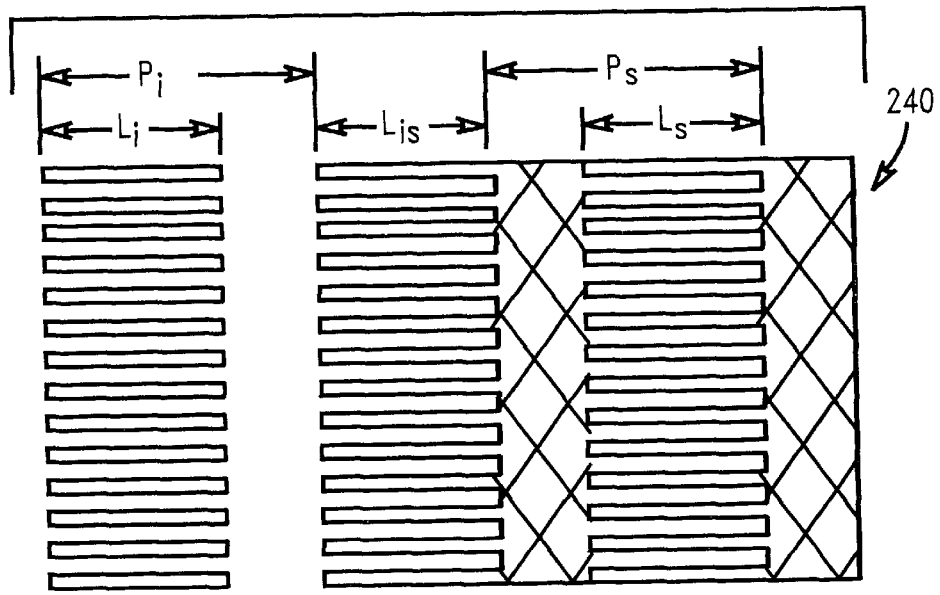
FIGS. 26a, 26b, 27a, 27b and 28a, 28b depict plan views of other targets utilizing contrasting tone reversing arrays.
Figure 26B:
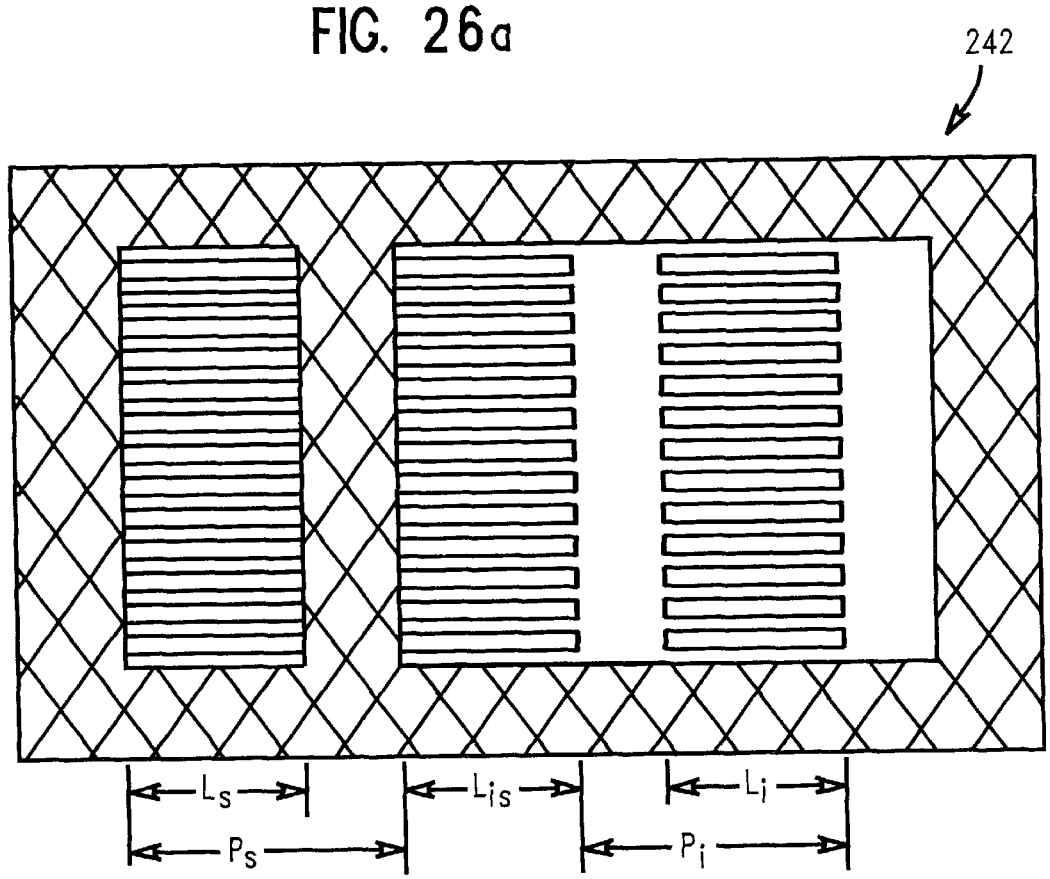

In FIGS. 26a, 26b there are shown complementary measurement targets 240, 242, respectively. Targets 240, 242 are the exact tone opposites of each other. On each target 240, 242 there may be measured lines/space length metrology dimensions ($L_i$, $L_s$ and $L_{is}$) and pattern pitch monitoring dimensions ($P_i$, $P_s$ and $P_{is}$) as shown with respect to the array edges. Pitches indicated can be measured along with pattern dimensions to monitor precision, cull bad measurements and/or determine pattern type with a pitch encoded target or label, as described in copending U.S. application Ser. No. 08/727,138 filed Oct. 8, 1996, the disclosure of which is hereby incorporated by reference. It may be noted that only one tone-reversing edge is present ($L_{is}$) in targets 240, 242.

Figure 27A:
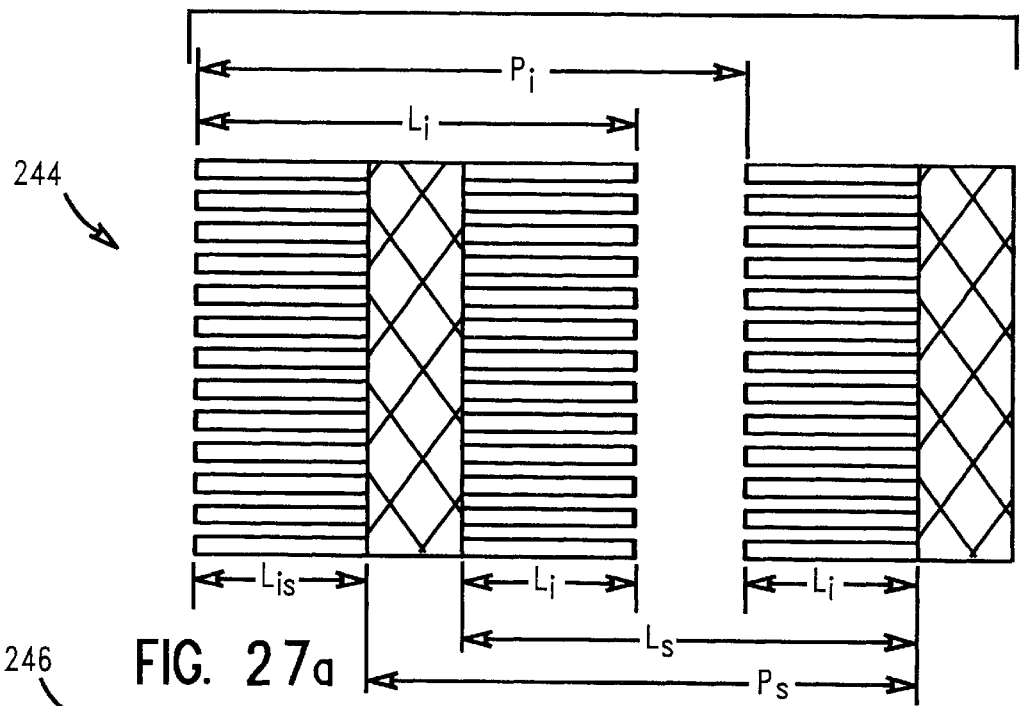
Figure 27B:
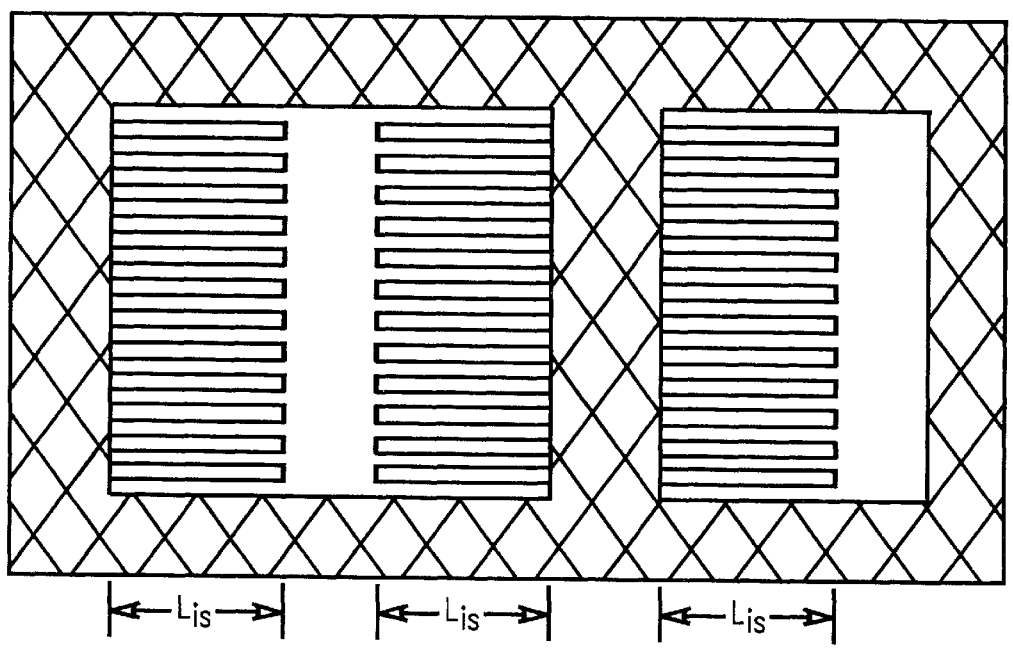
Figure 28A:
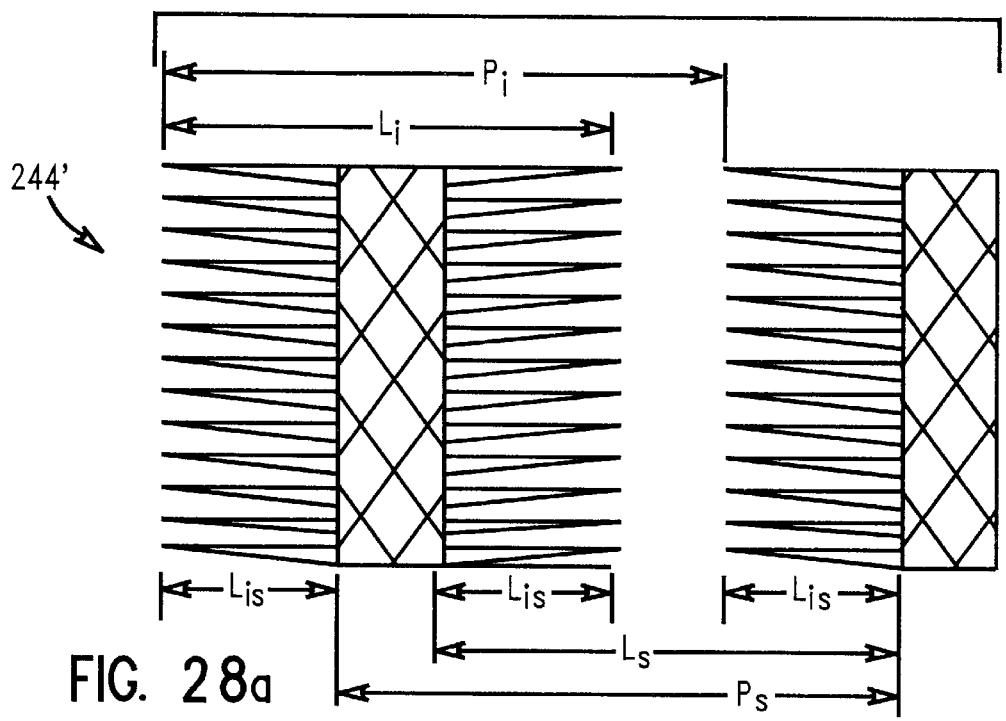
Figure 28B:
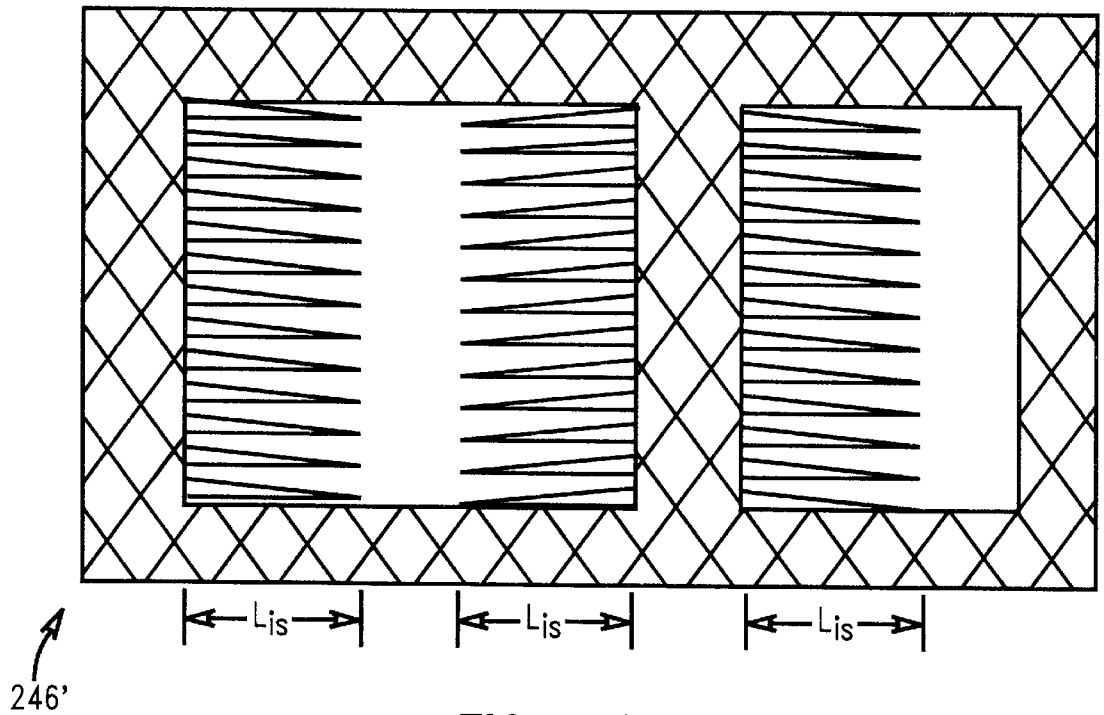
Figure 29:
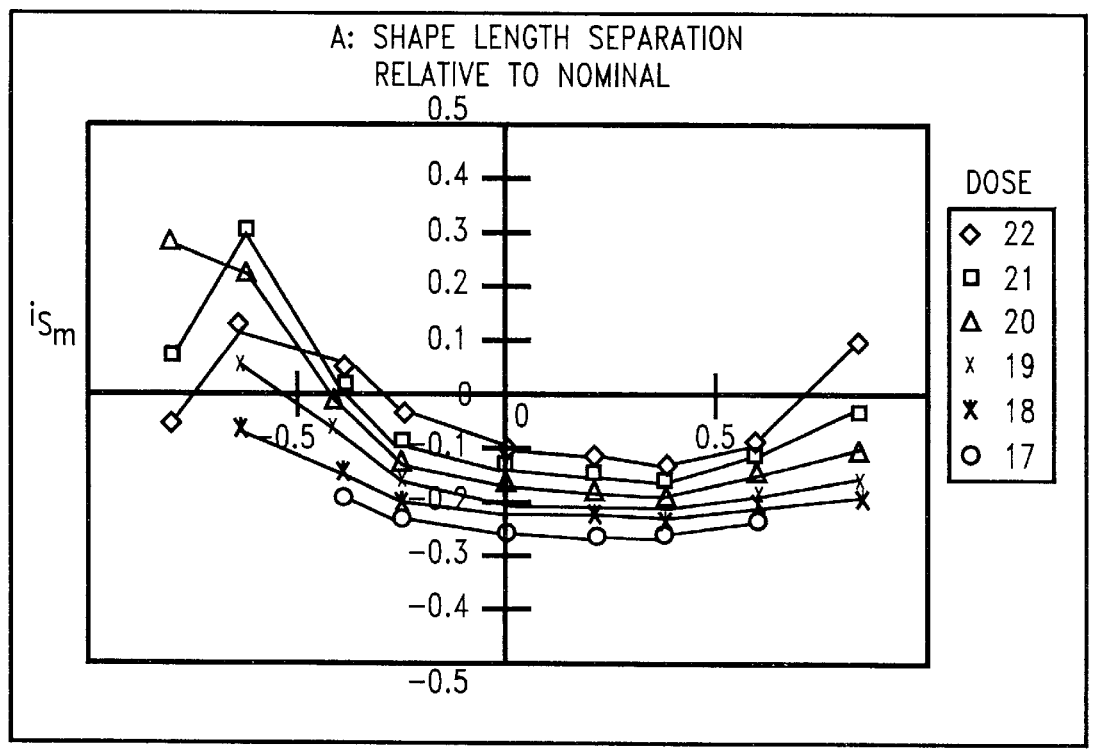
FIG. 29 is a plot of measured shape length separation as an function of expose dose for the target shown in FIG. 25.

Complementary measurement targets 244, 246 for optical line/space length metrology ($L_i$, $L_s$ and $L_{is}$) and pattern pitch monitoring ($P_i$, $P_s$ and $P_{is}$) are depicted in FIGS. 27a, 27b, respectively, where the line/space metrology and pitch structures overlap. In targets 244, 246, there are present three tone-reversing edges ($L_{is}$). FIGS. 28a, 28b show target 244', 246' similar to the respective targets in FIGS. 27a, 27b, except that tapered lines are used to form the arrays.

In the targets depicted in FIGS. 22a through 28b, measurements within a given target can be obtained in a single optical scan, as alternatives to the target of FIG. 25.

Figure 31:
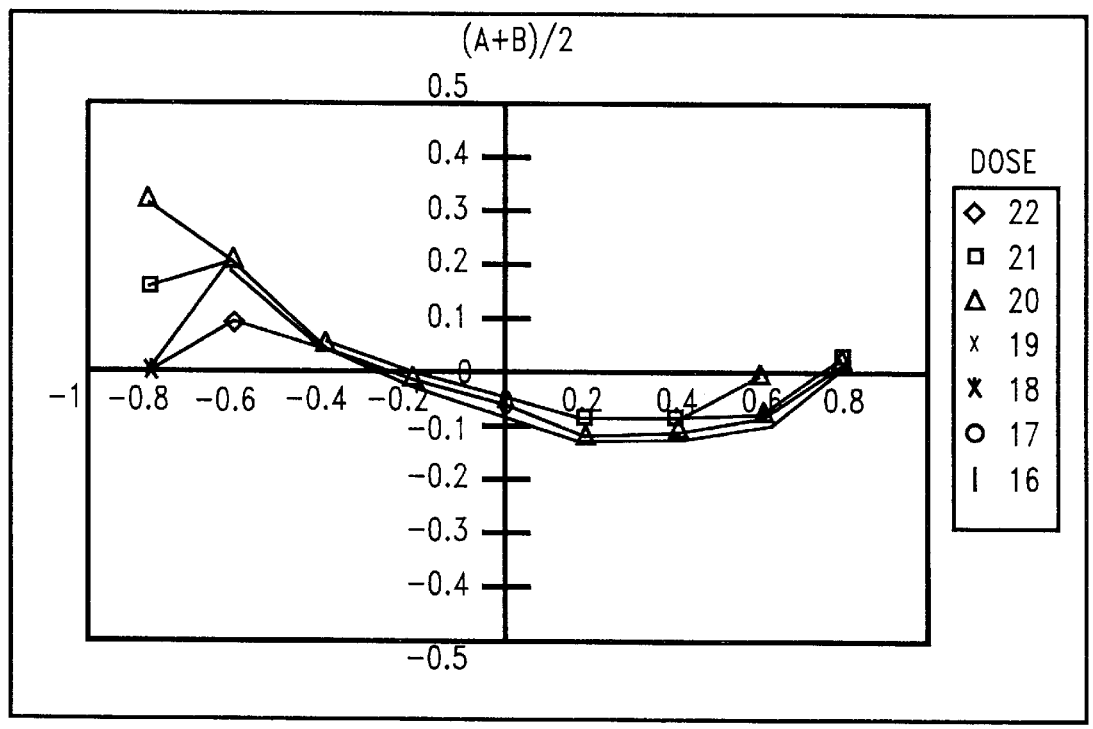
FIG. 31 is a plot of a function of the shape and space measurements as a function of defocus for the targets of FIG. 25.
Figure 30:
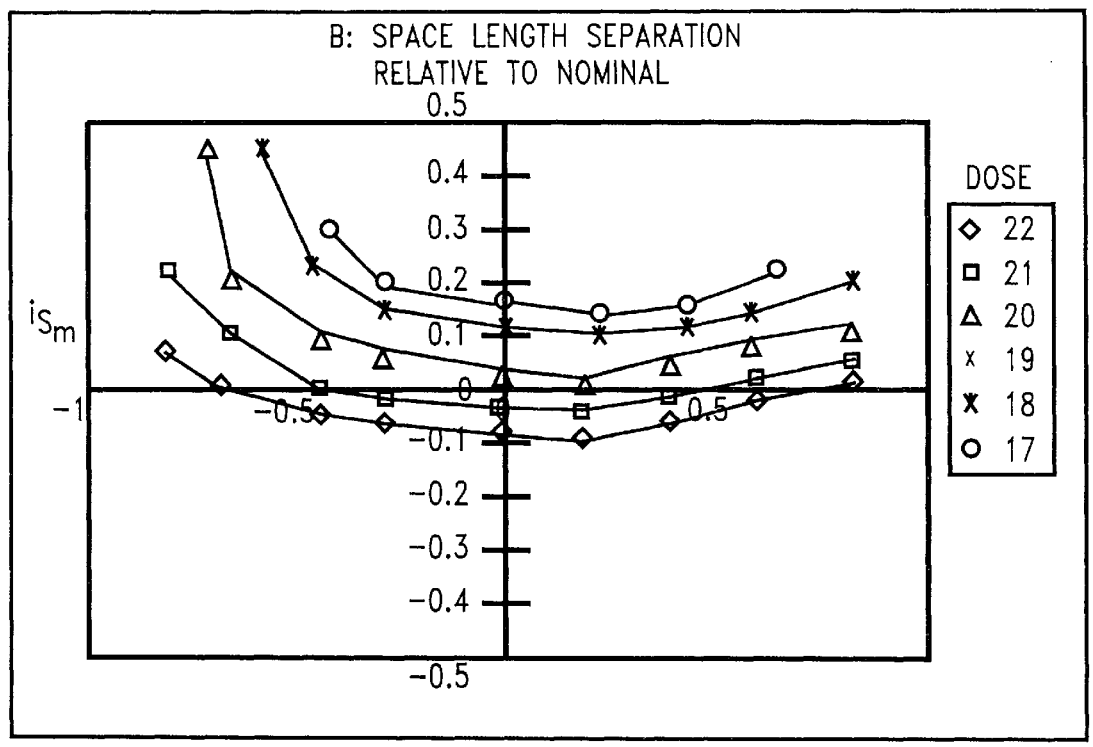
FIG. 30 is a plot of space length separation relative to nominal for the target shown in FIG. 25.
Figure 32:
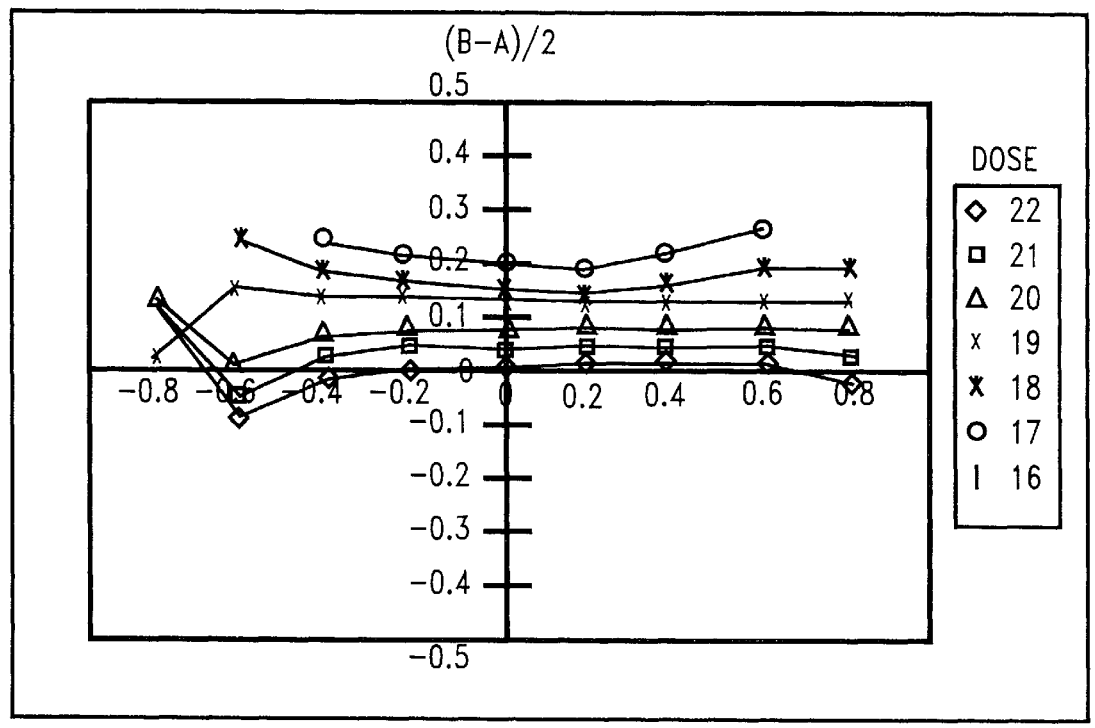
FIG. 32 is a plot of a function of the shape and space measurements as a function of defocus for the targets of FIG. 25.

FIGS. 29–36 depict optical measurements made on the target depicted in FIG. 25. Target dimension in units of microns are plotted against defocus in microns, and the legend for the plotted points is dose in units of millijoules/cm$^2$. The measurements are made on a target as shown in FIG. 25 where lines 175, 179 have a width of 0.275 microns and a spacing between lines of 0.275 microns. FIGS. 29–32 show examples of a complementary tone reversing target exposed and developed on a resist layer in which shape and space exhibit similar exposure sensitivity and defocus curvature. The $A = x_3 - x_2$ and $B = x_5 - x_4$ dimensions are nominally identical on the masks used to project the target images on the resist film, and these dimensions on the targets form corresponding image spaces and shapes. Dimension A plotted vertically in FIG. 29 indicates the shape length separation relative to nominal. Dimension B plotted vertically in FIG. 30 indicates the space length separation relative to nominal. FIG. 31 is a plot of (A+B)/2 and FIG. 32 is a plot of (B−A)/2.

Figure 33:
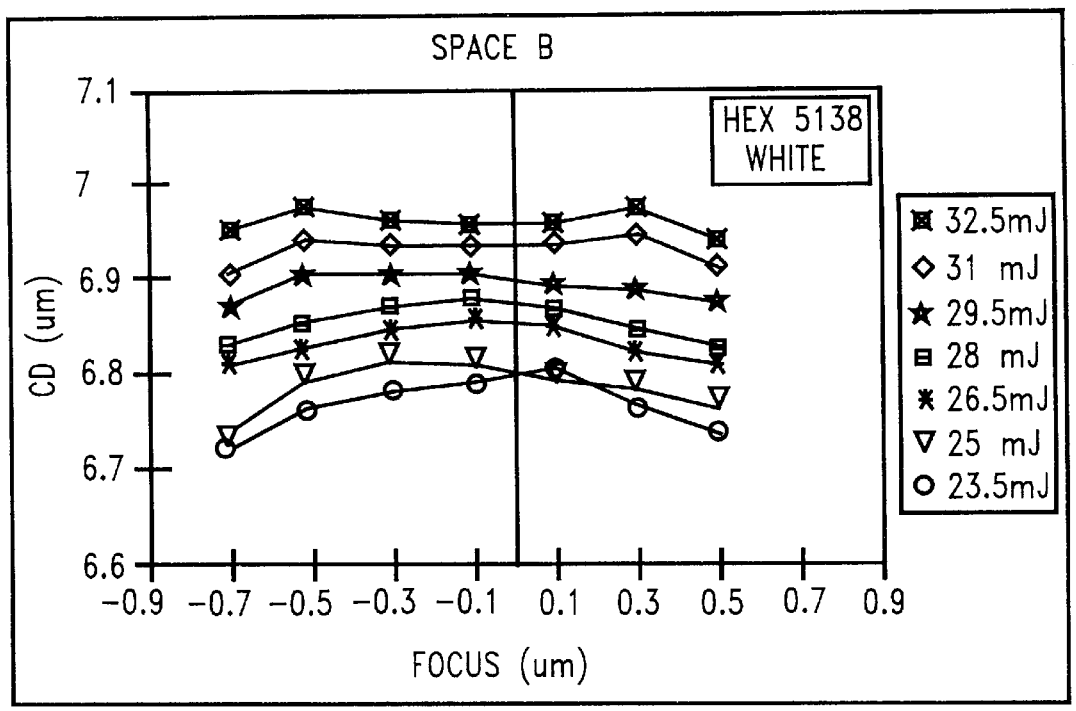
FIG. 33 is a plot of space length separation for the target shown in FIG. 25.
Figure 35:
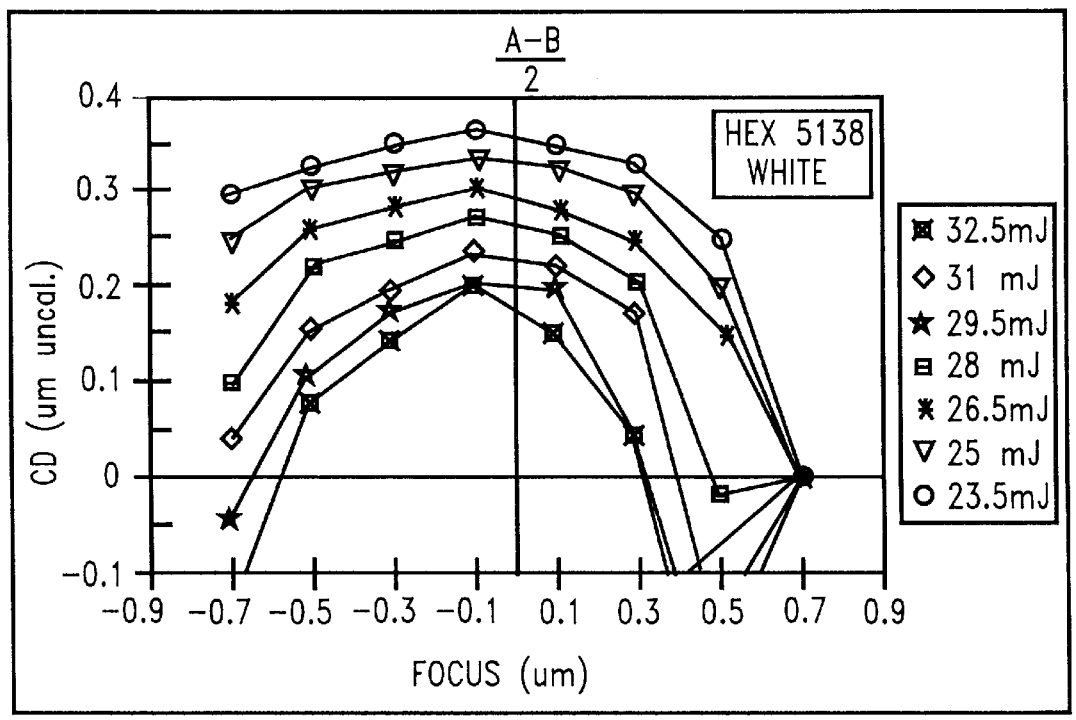
FIG. 35 is a plot of a function of the shape and space measurements as a function of defocus for the targets of FIG. 25.
Figure 34:
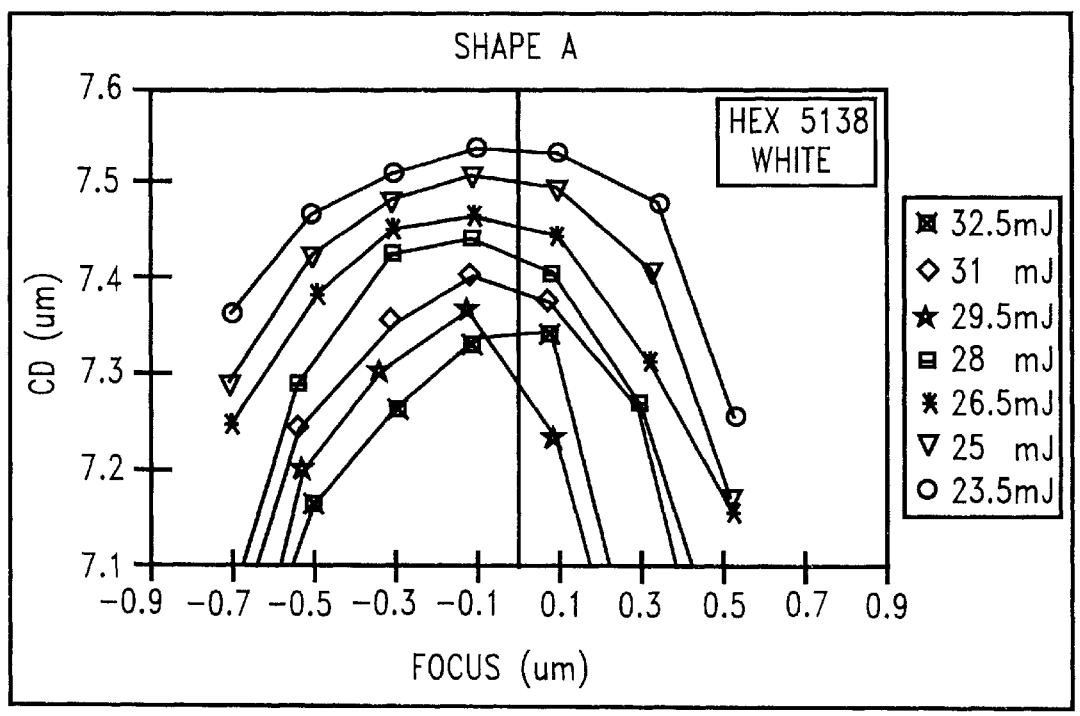
FIG. 34 is a plot of shape length separation relative to nominal for the target shown in FIG. 25.
Figure 36:
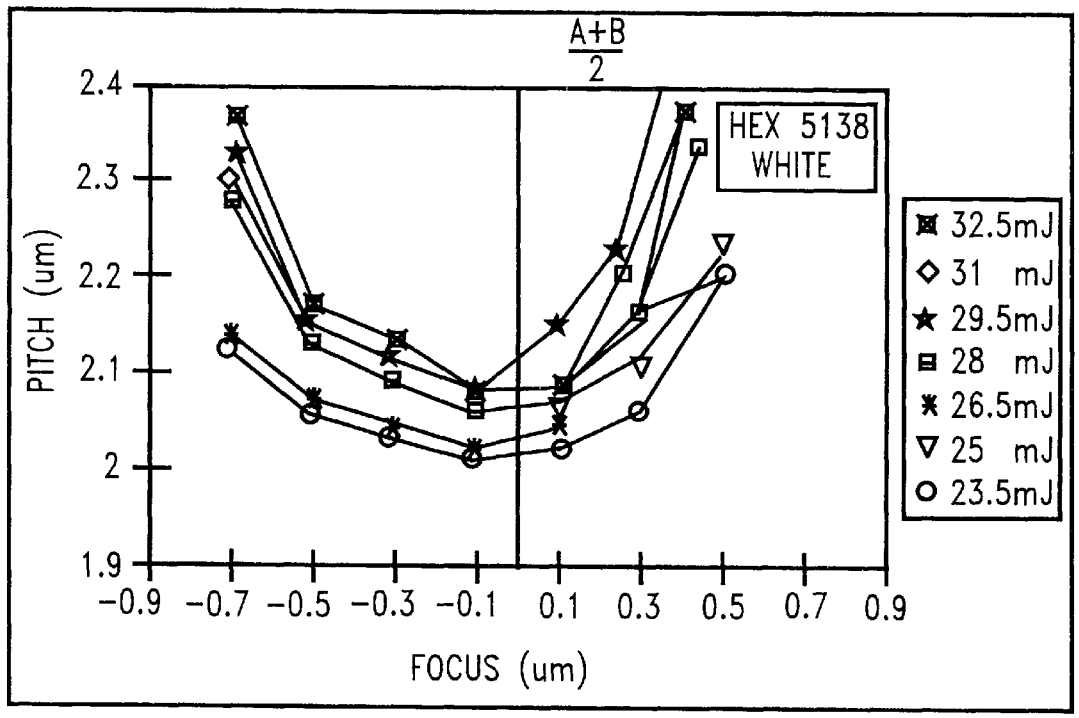
FIG. 36 is a plot of a function of the shape and space measurements as a function of defocus for the targets of FIG. 25.
Figure 1:
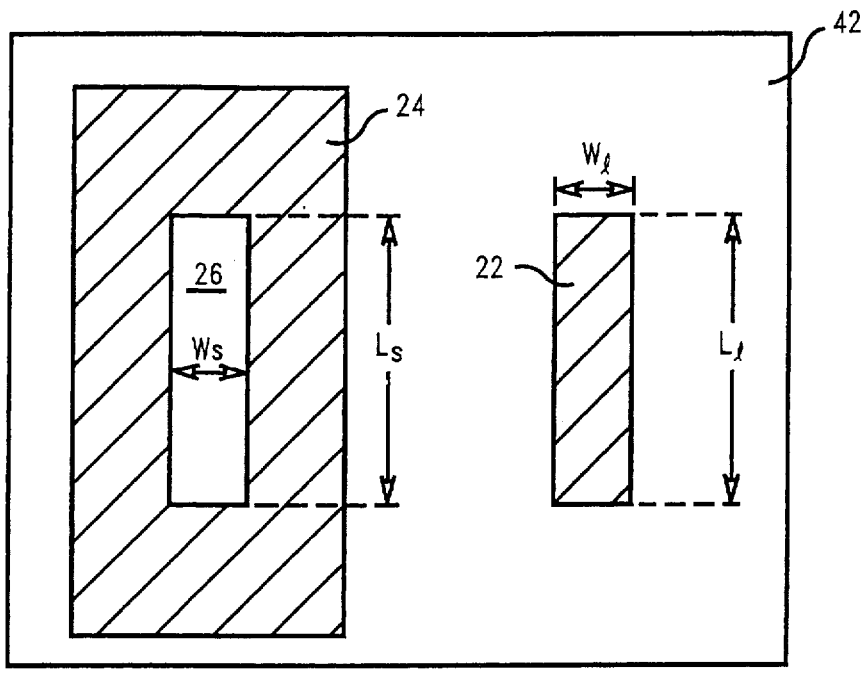

FIGS. 33–36 show examples of a target exposed and developed on a resist layer in which shape and space have significantly different exposure sensitivity and defocus curvature. In this case, dimension B plotted in FIG. 33 is the distance $x_6 - x_3$ in FIG. 25 indicates the measured space length. Dimension A plotted vertically in FIG. 34 is the distance $x_4 - x_1$ in FIG. 25, and indicates the measured shape length. FIG. 35 is a plot of (A−B)/2 and FIG. 36 is a plot of (A+B)/2. The case shown in FIGS. 34–37 is preferably analyzed by the method and system depicted FIG. 20 to cleanly separate dose and focus dependence.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process for controlling focus or exposure dose parameters in a lithographic process comprising the steps of:
   a) exposing a plurality of a first set of complementary tone patterns onto a resist film layer having a resist threshold disposed on a substrate, each of said first set of complementary tone patterns comprising: i) a first pattern portion having a shape which corresponds to an area on the resist film having an exposure dose below the resist threshold of the resist film and ii) a second pattern portion having a space which corresponds to an area on the resist film having an exposure dose above the resist threshold of the resist film, said shape and space having corresponding dimensions, each of said exposed first set of complementary tone patterns being exposed on said resist film under different focus or exposure dose conditions;
   b) measuring said dimensions of image shapes and spaces on each of said exposed first set of complementary tone patterns;

c) determining optimum focus or exposure dose conditions based on the measurements of step (b);

d) determining the dependence of focus or exposure dose conditions on said dimensions of the image shapes and spaces near the optimum focus or exposure dose conditions determined in step (c);

e) exposing one or more of a second set of complementary tone patterns onto a resist film layer having a resist threshold disposed on a substrate, each of said second set of complementary tone patterns comprising: i) a first pattern portion having a shape which corresponds to an area on the resist film having an exposure dose below the resist threshold of the resist film and ii) a second pattern portion having a space which corresponds to an area on the resist film having an exposure dose above the resist threshold of the resist film, said shape and space having corresponding dimensions;

f) measuring said dimensions of image shapes and spaces on each of said exposed second set of complementary tone patterns; and g) determining adequacy of focus or exposure dose parameters on each of said exposed second set of complementary tone patterns based on the measurements and determinations of steps (a)–(d).

2. The process of claim 1 further including the step of:

h) establishing focus or exposure dose parameters for subsequent exposure of a third set of complementary tone patterns by applying a measurement of said dimensions of image shapes and spaces on at least one of said exposed second set of complementary tone patterns to the dependence of focus or exposure dose conditions made in step (d).

3. The process of claim 1 further including the step of:

h) establishing focus or exposure dose parameters for subsequent exposure of a third set of complementary tone patterns by applying a measurement of said dimensions of image shapes and spaces on at least one of said exposed second set of complementary tone patterns to the dependence of focus or exposure dose conditions made in step (d) to predict a new focus or exposure dose parameter, and taking an average of the predicted new focus or exposure dose parameter and the focus or exposure dose parameter of said at least one of said exposed second set of complementary tone patterns.

4. The process of claim 1 wherein said dimensions of said shape and space are nominally identical, and wherein the adequacy of focus or exposure dose parameters are determined based on the dimensions on said image shape and space.

5. The process of claim 1 wherein the measuring of the dimensions of the image shapes and spaces on each of the exposed first and second sets of complementary tone patterns in steps (b) and (f) is by the steps of:

i) creating on said resist film a latent image of each space and an unexposed area within a latent image of each shape;

ii) measuring the dimension on each latent image space; and iii) measuring the dimension on the unexposed area within each latent image shape.

6. The process of claim 1 wherein the measuring of the dimensions of the image shapes and spaces on each of the exposed first and second sets of complementary tone patterns in steps (b) and (f) is by the steps of:

i) creating on said resist film a latent image of each space and an unexposed area within a latent image of each shape;

ii) contacting each latent image space and shape on the resist film with a developer to remove selected portions of the resist film to create developed images corresponding to each latent image space and shape, respectively;

iii) measuring the dimension on each developed image shape; and iv) measuring the dimension on each developed image space.

7. The process of claim 1 wherein said shape and space are rectangular having a width and a length, and wherein the adequacy of focus or exposure dose parameters are determined based on the width or length dimensions on said image shape and space.

8. The process of claim 7 wherein said rectangular shape and space have a width and a length greater than said width, and wherein the adequacy of focus or exposure dose parameters are determined based on the width or length dimensions on said image shape and space.

9. The process of claim 1 wherein said shape and space have opposed points formed by acute angles, and wherein the adequacy of focus or exposure dose parameters are determined as a mathematical function of the distances between the opposed points formed by acute angles on said image shape and space.

10. The process of claim 9 wherein said shape and space have a width and a length greater than said width, and wherein the adequacy of focus or exposure dose parameters are determined based on the width or length dimensions on said image shape and space.

* * * * *

UNITED STATES PATENT AND TRADEMARK OFFICE
CERTIFICATE OF CORRECTION

PATENT NO. : 5,965,309                                   Page 1 of 2
DATED       : October 12, 1999
INVENTOR(S) : Christopher P. Ausschnitt et al.

It is certified that error appears in the above-identified patent and that said Letters Patent is hereby corrected as shown below:

In the Drawings

Delete Fig. 1 and Figs. 2a-2f, and replace with the correct Fig. 1 and Fig. 2 attached herewith.